United States Patent
Tatsumura et al.

(10) Patent No.: US 8,908,408 B2
(45) Date of Patent: Dec. 9, 2014

(54) CIRCUIT HAVING PROGRAMMABLE MATCH DETERMINATION FUNCTION, AND LUT CIRCUIT, MUX CIRCUIT AND FPGA DEVICE WITH SUCH FUNCTION AND METHOD OF DATA WRITING

(75) Inventors: Kosuke Tatsumura, Kanagawa (JP); Masato Oda, Kanagawa (JP); Atsuhiro Kinoshita, Kanagawa (JP); Koichiro Zaitsu, Kanagawa (JP); Mari Matsumoto, Kanagawa (JP); Shinichi Yasuda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 231 days.

(21) Appl. No.: 13/613,701

(22) Filed: Sep. 13, 2012

(65) Prior Publication Data
US 2014/0035618 A1 Feb. 6, 2014

(30) Foreign Application Priority Data

Aug. 3, 2012 (JP) ................................ 2012-172854

(51) Int. Cl.
*G11C 15/00* (2006.01)
(52) U.S. Cl.
USPC ..................... 365/49.1; 365/49.17
(58) Field of Classification Search
CPC ....... G11C 15/046; G11C 15/00; G11C 15/04
USPC ............................................ 365/49.1, 49.17
See application file for complete search history.

(56) References Cited

U.S. PATENT DOCUMENTS

| 4,642,487 A | 2/1987 | Carter |
| 4,870,302 A | 9/1989 | Freeman |
| 5,371,697 A | 12/1994 | Yamada |
| 6,961,741 B2 | 11/2005 | Swami |
| 8,169,808 B2 | 5/2012 | Roohparvar |
| 8,310,852 B2 * | 11/2012 | Watanabe et al. .......... 365/49.17 |
| 2012/0206963 A1 | 8/2012 | Kinoshita |

OTHER PUBLICATIONS

Pagiamtzis, K. et al., "Content-Addressable Memory (CAM) Circuits and Architectures: A Tutorial and Survey," IEEE Journal of Solid-State Circuits, vol. 41, No. 3, pp. 712-727, (Mar. 2006).

* cited by examiner

*Primary Examiner* — Son Dinh
*Assistant Examiner* — Nam Nguyen
(74) *Attorney, Agent, or Firm* — Finnegan, Henderson, Farabow, Garrett & Dunner, L.L.P.

(57) ABSTRACT

A circuit according to embodiments includes: a plurality of bit-string comparators each of which includes a plurality of single-bit comparators each of which includes first and second input terminals, first and second match-determination terminals, and a memory storing data and inverted data in a pair, the first input terminal being connected to a respective search line, the second input terminal being connected to an inverted search line being paired with the respective search line, and a matching line connecting the first and second match-determination terminals of the single-bit comparators; a pre-charge transistor of which source is connected to a supply voltage line; a common matching line connected to a drain of the pre-charge transistor and the matching lines of the bit-string comparators; and an output inverter of which input is connected to the common matching line.

22 Claims, 32 Drawing Sheets

FIG.4

| SEARCH DATA | S | $\overline{S}$ |
|---|---|---|
| 0 | V_read | V_pass |
| 1 | V_pass | V_read |
| MASK | V_pass | V_pass |

FIG.5

| STORAGE DATA | D | $\overline{D}$ |
|---|---|---|
| 0 | Vth_HIGH | Vth_LOW |
| 1 | Vth_LOW | Vth_HIGH |
| X(don't care) | Vth_LOW | Vth_LOW |

FIG.6

| | | SEARCH DATA | | |
|---|---|---|---|---|
| | | 0 | 1 | MASK |
| STORAGE DATA | 0 | ON/ON MATCH | ON/OFF MISS | ON/ON MATCH |
| | 1 | OFF/ON MISS | ON/ON MATCH | ON/ON MATCH |
| | X | ON/ON MATCH | ON/ON MATCH | ON/ON MATCH |

M1/M2 STATE

FIG.7

| CASE# | IN1 | IN2 | IN3 | IN4 | OUT | Stored |
|---|---|---|---|---|---|---|
| 1 | 0 | 0 | 0 | 0 | 0 | |
| 2 | 0 | 0 | 0 | 1 | 1 | Stored |
| 3 | 0 | 0 | 1 | 0 | 0 | |
| 4 | 0 | 0 | 1 | 1 | 0 | |
| 5 | 0 | 1 | 0 | 0 | 1 | Stored |
| 6 | 0 | 1 | 0 | 1 | 1 | Stored |
| 7 | 0 | 1 | 1 | 0 | 0 | |
| 8 | 0 | 1 | 1 | 1 | 0 | |
| 9 | 1 | 0 | 0 | 0 | 1 | Stored |
| 10 | 1 | 0 | 0 | 1 | 1 | Stored |
| 11 | 1 | 0 | 1 | 0 | 1 | Stored |
| 12 | 1 | 0 | 1 | 1 | 1 | Stored |
| 13 | 1 | 1 | 0 | 0 | 0 | |
| 14 | 1 | 1 | 0 | 1 | 0 | |
| 15 | 1 | 1 | 1 | 0 | 1 | Stored |
| 16 | 1 | 1 | 1 | 1 | 0 | |

| CASE# | IN1 | IN1 | IN1 | IN1 | OUT |
|---|---|---|---|---|---|
| 1  | 0 | 0 | 0 | 0 | 0 |
| 2  | 0 | 0 | 0 | 1 | 1 } 0001 |
| 3  | 0 | 0 | 1 | 0 | 0 |
| 4  | 0 | 0 | 1 | 1 | 0 |
| 5  | 0 | 1 | 0 | 0 | 1 } 010X |
| 6  | 0 | 1 | 0 | 1 | 1 |
| 7  | 0 | 1 | 1 | 0 | 0 |
| 8  | 0 | 1 | 1 | 1 | 0 |
| 9  | 1 | 0 | 0 | 0 | 1 } 100X  ⎫ |
| 10 | 1 | 0 | 0 | 1 | 1        ⎬ 10XX |
| 11 | 1 | 0 | 1 | 0 | 1 } 101X  ⎭ |
| 12 | 1 | 0 | 1 | 1 | 1 |
| 13 | 1 | 1 | 0 | 0 | 0 |
| 14 | 1 | 1 | 0 | 1 | 0 |
| 15 | 1 | 1 | 1 | 0 | 1 } 1110 |
| 16 | 1 | 1 | 1 | 1 | 0 |

| CASE# | IN1 | IN1 | IN1 | IN1 | OUT |
|-------|-----|-----|-----|-----|-----|
| 1     | 0   | 0   | 0   | 0   | 1 ← |
| 2     | 0   | 0   | 0   | 1   | 0   |
| 3     | 0   | 0   | 1   | 0   | 0   |
| 4     | 0   | 0   | 1   | 1   | 1 ← |
| 5     | 0   | 1   | 0   | 0   | 0   |
| 6     | 0   | 1   | 0   | 1   | 1 ← |
| 7     | 0   | 1   | 1   | 0   | 1 ← |
| 8     | 0   | 1   | 1   | 1   | 0   |
| 9     | 1   | 0   | 0   | 0   | 0   |
| 10    | 1   | 0   | 0   | 1   | 1 ← |
| 11    | 1   | 0   | 1   | 0   | 1 ← |
| 12    | 1   | 0   | 1   | 1   | 0   |
| 13    | 1   | 1   | 0   | 0   | 1 ← |
| 14    | 1   | 1   | 0   | 1   | 0   |
| 15    | 1   | 1   | 1   | 0   | 0   |
| 16    | 1   | 1   | 1   | 1   | 1 ← |

FIG.19

| SEARCH DATA | S | $\bar{S}$ |
|---|---|---|
| 0 | V_read | V_off |
| 1 | V_off | V_read |
| MASK | V_off | V_off |

FIG.20

| STORAGE DATA | D | $\bar{D}$ |
|---|---|---|
| 0 | Vth_LOW | Vth_HIGH |
| 1 | Vth_HIGH | Vth_LOW |
| X (don't care) | Vth_HIGH | Vth_HIGH |

FIG.21

| | | SEARCH DATA | | |
|---|---|---|---|---|
| | | 0 | 1 | MASK |
| STORAGE DATA | 0 | OFF/OFF MATCH | OFF/ON MISS | OFF/OFF MATCH |
| | 1 | ON/OFF MISS | OFF/OFF MATCH | OFF/OFF MATCH |
| | X | OFF/OFF MATCH | OFF/OFF MATCH | OFF/OFF MATCH |

M1/M2 STATE

FIG.22

| CASE# | IN1 | IN2 | IN3 | IN4 | OUT | Stored |
|---|---|---|---|---|---|---|
| 1 | 0 | 0 | 0 | 0 | 0 | |
| 2 | 0 | 0 | 0 | 1 | 1 | Stored |
| 3 | 0 | 0 | 1 | 0 | 0 | |
| 4 | 0 | 0 | 1 | 1 | 0 | |
| 5 | 0 | 1 | 0 | 0 | 1 | Stored |
| 6 | 0 | 1 | 0 | 1 | 1 | Stored |
| 7 | 0 | 1 | 1 | 0 | 0 | |
| 8 | 0 | 1 | 1 | 1 | 0 | |
| 9 | 1 | 0 | 0 | 0 | 1 | Stored |
| 10 | 1 | 0 | 0 | 1 | 1 | Stored |
| 11 | 1 | 0 | 1 | 0 | 1 | Stored |
| 12 | 1 | 0 | 1 | 1 | 1 | Stored |
| 13 | 1 | 1 | 0 | 0 | 0 | |
| 14 | 1 | 1 | 0 | 1 | 0 | |
| 15 | 1 | 1 | 1 | 0 | 1 | Stored |
| 16 | 1 | 1 | 1 | 1 | 0 | |

US 8,908,408 B2

CIRCUIT HAVING PROGRAMMABLE MATCH DETERMINATION FUNCTION, AND LUT CIRCUIT, MUX CIRCUIT AND FPGA DEVICE WITH SUCH FUNCTION AND METHOD OF DATA WRITING

CROSS-REFERENCE TO RELATED APPLICATION(S)

This application based upon and claims the benefit of priority from Japanese Patent Application No. 2012-172854, filed on Aug. 3, 2012; the entire contents of which are incorporated herein by reference.

FIELD

Embodiments described herein relate generally to a circuit having a programmable match determination function, and a LUT circuit, a MUX circuit and a FPGA device with such function and a method of data writing.

BACKGROUND

A reconfigurable logic circuit as typified by a field programmable gate array (FPGA) realizes a predetermined logic (circuit configuration) based on data stored in a configuration memory.

As main circuit components of a FPGA, there are a LUT (look-up-table) realizing an arbitrary truth table and a MUX (multiplexer) selectively outputting a predetermined signal from among a plurality of input signals.

The conventional LUT is structured with configuration memories and a selection circuit unit. The LUT outputs data stored in one of the configuration memories selected by the selection circuit according to an input signal.

The conventional MUX is structured with a configuration memory and a selection circuit. The MUX outputs one input signal selected by the selection circuit from among a plurality of input signals according to data stored in the configuration memory.

In this way, because the conventional LUT and MUX are respectively structured by one or more configuration memories and a selection circuit, they have comparatively large circuit sizes. Therefore, the conventional LUT and MUX have had such a problem in that a chip area being large, or a signal delay being long.

BRIEF DESCRIPTION OF DRAWINGS

FIG. 4 is a diagram showing a combination example of search data to be supplied to each search line pair;

FIG. 5 is a diagram showing a combination example of storage data stored in the non-volatile memory transistors;

FIG. 6 is a diagram showing states of the non-volatile memory transistors in response to the search data and the storage data;

FIG. 7 is a diagram showing a 4-input 1-output truth table and a method for storing the truth table in the LUT circuit;

FIG. 19 is a diagram showing a combination example of search data to be supplied to each search line pair;

FIG. 20 is a diagram showing a combination example of storage data stored in the non-volatile memory transistor;

FIG. 21 is a diagram showing states of the non-volatile memory transistor in response to the search data and the storage data;

FIG. 22 is a diagram showing a 4-input 1-output truth table and a method for storing the truth table in the LUT circuit;

DETAILED DESCRIPTION

Summary

Figure 1:
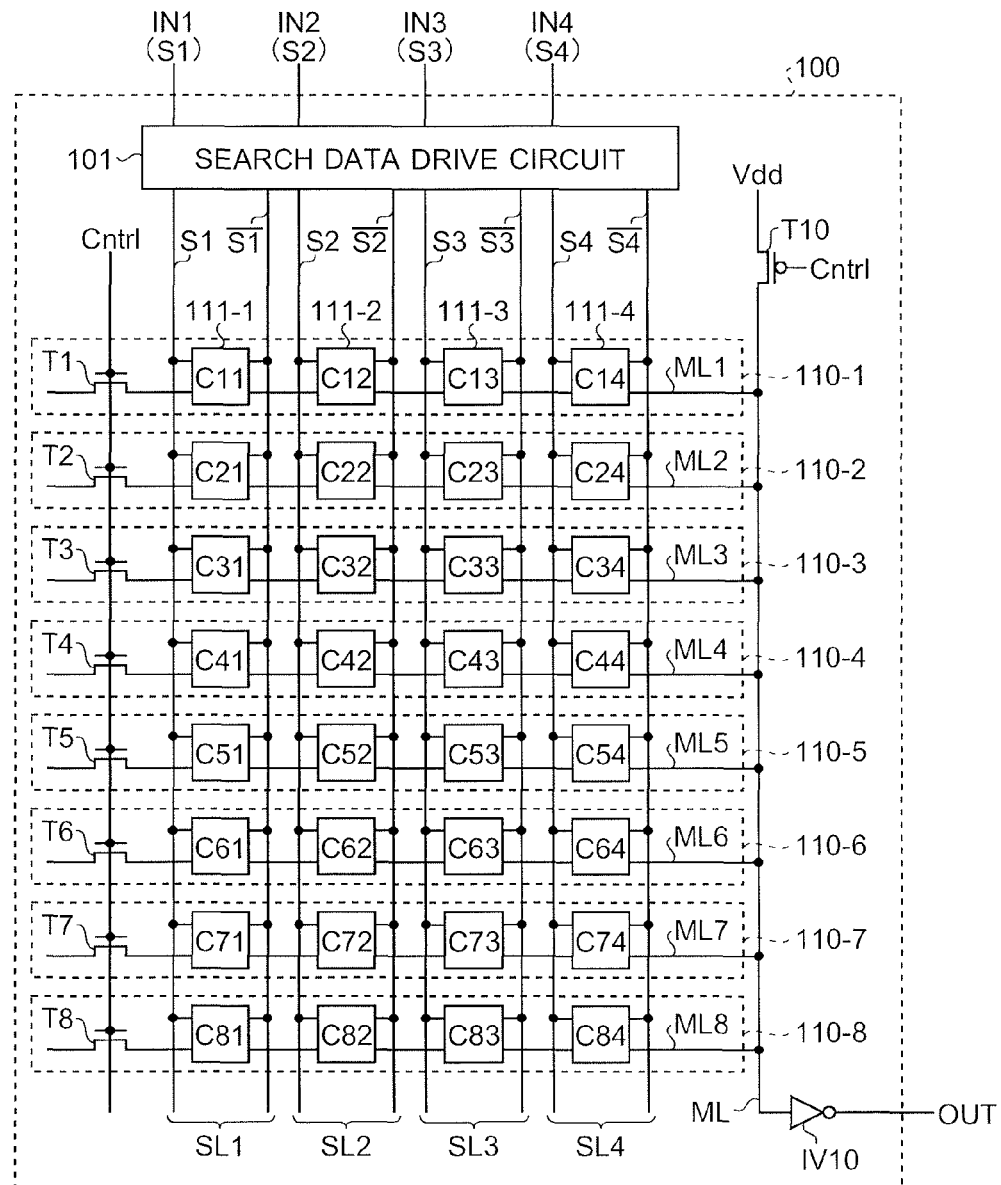
FIG. 1 is a circuit diagram showing an outline structure of a LUT circuit according to a first embodiment.

According to one aspect of embodiments, a circuit comprises: a plurality of bit-string comparators each of which includes a plurality of single-bit comparators each of which includes first and second input terminals, first and second match-determination terminals, and a memory storing data and inverted data in a pair, the first input terminal being connected to a respective search line, the second input terminal being connected to an inverted search line being paired with the respective search line, and a matching line connecting the first and second match-determination terminals of the single-bit comparators; a pre-charge transistor of which source is connected to a supply voltage line; a common matching line connected to a drain of the pre-charge transistor and the matching lines of the bit-string comparators; and an output inverter of which input is connected to the common matching line.

According to another aspect of the embodiments, a circuit comprises: a common matching line; a plurality of bit-string comparators each of which includes a plurality of single-bit comparators each of which includes first and second input terminals, first and second match-determination terminals, and a memory storing data and inverted data in a pair, the first input terminal being connected to a respective search line, the second input terminal being connected to an inverted search line being paired with the respective search line, a matching line connecting the first and second match-determination terminals of the single-bit comparators, a first transistor of which gate is connected to the matching line and drain is connected to the common matching line, and a first pre-charge transistor of which drain is connected to the matching line and source is connected to a supply voltage line; a second pre-charge transistor of which source is connected to the supply voltage line and drain is connected to the common matching line; and an output inverter of which input is connected to the common matching line.

According to yet another aspect of the embodiments, a circuit comprises: a bit-string comparator including a plurality of single-bit comparators each of which includes first and second input terminals, first and second match-determination terminals, and a memory storing data and inverted data in a pair, the first input terminal being connected to a respective search line, the second input terminal being connected to an inverted search line being paired with the respective search line, and a matching line connecting the first and second match-determination terminals of the single-bit comparators; a pre-charge transistor of which source is connected to a supply voltage line; a common matching line connected to a drain of the pre-charge transistor and the matching line; and an output inverter of which input is connected to the common matching line.

In the following, a circuit having a programmable match determination function, and a LUT circuit, a MUX circuit and a FPGA device with such function and a method of data writing according to exemplified embodiments will be described in detail with reference to the accompanying drawings.

First Embodiment

Firstly, a LUT circuit according to a first embodiment will be described in detail with reference to the accompanying drawings. In the first embodiment, a LUT circuit having a match determination function with respect to input data will be described as an example. FIG. 1 is a circuit diagram showing an outline structure of a LUT circuit according to the first embodiment.

As shown in FIG. 1, the LUT circuit 100 has bit-string comparators 110-$x$ ($x$ is one of integers 1 to 8), a plurality of search line pairs SLx ($x$ is one of integers 1 to 4), a common matching line ML, a pre-charge transistor T10, an output inverter IV10 and a search data drive circuit 101. In the first embodiment, there may be one or more bit-string comparators 110-$x$.

To the search data drive circuit 101, for instance, each bit INx ($x$ is one of integers 1 to 4) in the input data is inputted in parallel. In FIG. 1, a case where the input data is 4 bits is shown. Moreover, to the search data drive circuit 101, the search line pairs SLx of which number corresponds to the bit number of the input data are connected in parallel. Each search line pair SLx is constructed from a search line Sx ($x$ is one of integers 1 to 4) and an inverted search line /Sx ($x$ is one of integers 1 to 4); the search line Sx and the inverted search line /Sx being parallel to each other. In this explanation, characters with overbars in as shown in the figures are expressed with '/' in front of the characters.

To the search line Sx of the search line pair SLx corresponding to each input bit, the search data drive circuit 101 applies voltage according to the corresponding bit value as search data. For the purpose of clarifying the explanation, a reference number for this search data will be 'S'. Moreover, to the inverted search line /Sx of each search line pair SLx, the search data drive circuit 101 applies voltage according to an inverted value of the corresponding bit value as search data. For the purpose of clarifying the explanation, a reference number for this search data will be '/S'. In addition, the search data drive circuit 101 can apply a common mask bit MASK to the search line Sx and the inverted search line /Sx of the search line pair SLx corresponding to a bit to which matching determination is not to be executed.

Each bit-string comparator 110-x has single-bit comparators 111-x (x is one of integers 1 to 4) of which number corresponds to the number of input bits, matching lines MLx (x is one of integers 1 to 8) to which the single-bit comparators 111-x are commonly connected, and switching transistors Tx (x is one of integers 1 to 8) for controlling current from the matching lines MLx. To gates of the switching transistors Tx, for instance, a control voltage Cntrl is applied.

Each single-bit comparator 111-x has at least first and second input terminals, first and second match-determination terminals and a memory for storing data. The first and second match-determination terminals are connected to the matching line MLx. In the following explanation, for distinguishing from the search data to be applied to the search line pair SLx, data stored in the memory will be referred to as storage data.

The matching lines MLx of the respective bit-string comparators 110-x are commonly connected to the common matching line ML. The common matching line ML is connected to a pre-charge transistor T10 for letting a current-flow from a line of a supply voltage Vdd flow/shut off. To a gate of the pre-charge transistor T10, a control voltage Cntrl for controlling current inflow from the line of the supply voltage Vdd, for instance is applied. Matching determination data of the common matching line ML is outputted from an output OUT through the output inverter IV10. The matching determination data of the common matching line ML is to be expressed as presence/absence of charge.

Figure 2:
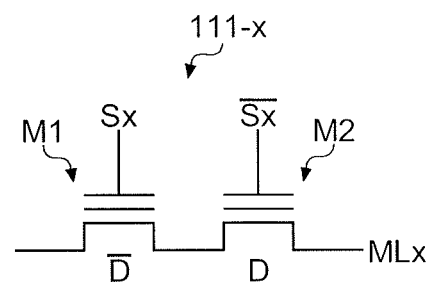
FIG. 2 is a circuit diagram showing an example of a single-bit comparator shown in FIG. 1.

One example of the single-bit comparator 111-x as illustrated in FIG. 1 is shown in FIG. 2. In FIG. 2, a NAND-type single-bit comparator 111-x is shown. As shown in FIG. 2, the single-bit comparator 111-x has a structure in that two non-volatile memory transistors M1 and M2 are connected on the matching line MLx in series. A source terminal of the non-volatile memory transistor M1 is connected to the first match-determination terminal. A drain terminal of the non-volatile memory transistor M2 is connected to the second match-determination terminal. A drain terminal of the non-volatile memory transistor M1 and a source terminal of the non-volatile memory transistor M2 are connected to each other.

The non-volatile memory transistor M1 stores an inverted value of the storage data D (inverted storage data /D), while a gate terminal thereof is connected to the first input terminal connected to the search line Sx. On the other hand, the non-volatile memory transistor M2 stores the storage data D, and a gate terminal thereof is connected to the second input terminal connected to the inverted search line /Sx.

Figure 3:
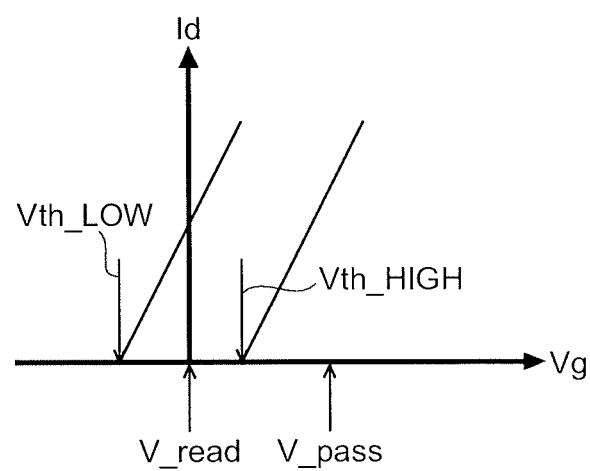
FIG. 3 is a diagram showing a relationship between a voltage value of search data to be supplied to the single-bit comparator of FIG. 2 and a voltage value (threshold) of storage data stored in non-volatile memory transistors.

Here, the operation of the single-bit comparator 111-x shown in FIG. 2 will be described. FIG. 3 shows a relationship between a voltage value of the search data S and /S to be supplied to the single-bit comparator of FIG. 2 and a voltage value (threshold) of the storage data D and /D stored in the non-volatile memory transistors M1 and M2. FIG. 4 shows a combination example of the search data S and /S to be supplied to each search line pair SLx. FIG. 5 shows a combination example of the storage data D and /D stored in the non-volatile memory transistors M1 and M2. FIG. 6 shows states of the non-volatile memory transistors M1 and M2 in accordance with the search data and the storage data;

As shown in FIG. 3, a threshold voltage Vth (corresponding to the storage data) in an erased state of the non-volatile memory transistor is defined as a first threshold voltage Vth_LOW, a threshold voltage Vth (corresponding to the storage data) in a written state of the non-volatile memory transistor is defined as a second threshold voltage Vth_HIGH, a voltage being higher than the first threshold voltage Vth_LOW and being lower than the second threshold voltage Vth_HIGH is defined as a readout voltage V_read, and a voltage being higher than the second threshold voltage Vth_HIGH is defined as a transfer voltage V_pass. The non-volatile memory transistor becomes a conduction state (ON-state) when search data with a voltage value being higher than a voltage value (threshold) of the storage data being stored therein is applied to the gate thereof.

Here, as for the NAND-type single-bit comparator 111-x shown in FIG. 2, a combination of the search data S and /S to be applied to the search line pairs SLx is set as a combination shown in FIG. 4, and a combination of the storage data D and /D to be stored in the non-volatile memory transistors M2 and M1 is set as a combination shown in FIG. 5.

Specifically, firstly, as shown in FIG. 4, applied voltages to the search line Sx and the inverted search line /Sx (corresponding to the search data S and /S) are respectively set as the readout voltage V_read and the transfer voltage V_pass when the search data (input bit value) is '0', and are respectively set as the transfer voltage V_pass and the readout voltage V_read when the search data (input bit value) is '1'. When the search data (input bit value) is the mask bit MASK, the applied voltages to the search line Sx and the inverted search line /Sx are commonly set as the transfer voltage V_pass.

As shown in FIG. 5, the storage data D and /D to be stored in the single-bit comparator 111-x are respectively set as the second threshold voltage Vth_HIGH and the first threshold voltage Vth_LOW when the storage data is '0', and are respectively set as the first threshold voltage Vth_LOW and the second threshold voltage Vth_HIGH when the storage data is '1'. When the storage data is a don't-care bit X, both the storage data D and /D to be stored in the single-bit comparator 111-x are set as the first threshold voltage Vth_LOW.

In this way, as shown in FIG. 6, it is possible to achieve the operation of the single-bit comparator 111-x in accordance with the combinations of the search data and the storage data. That is, when the combination of the search data and the storage data is a combination of '0' and '1' or a combination of '1' and '0', either the non-volatile memory transistor M1 or M2 becomes a shut-off state (OFF-state). As a result, the first and second terminals will get electrically separated from each other. This state is a miss-matching state in the operation of matching determination. On the other hand, in the other cases, the non-volatile memory transistors M1 and M2 become a conduction state (ON-state). As a result, the first and second terminals will get electrically shorted with each other. This state is a matching state in the operation of matching determination.

In FIG. 4, the mask bit MASK is search data S and /S to be outputted to the search line pair SLx corresponding to a certain bit in the input data to which matching determination is not to be executed. As shown in 'MASK' of FIG. 6, the single-bit comparator 111-x connected to the search line pair SLx to which mask bit MASK has been applied as the search data determines the state as the matching state with respect to all combinations. Furthermore, in FIG. 5, the don't-care bit X is storage data D and /D to be stored in the single-bit comparator 111-x which does not execute the matching determination. As shown in 'X' of FIG. 6, the single-bit comparator 111-x storing the don't-care bit X as the storage data determines the state as the matching state with respect to all combinations.

Figure 8:
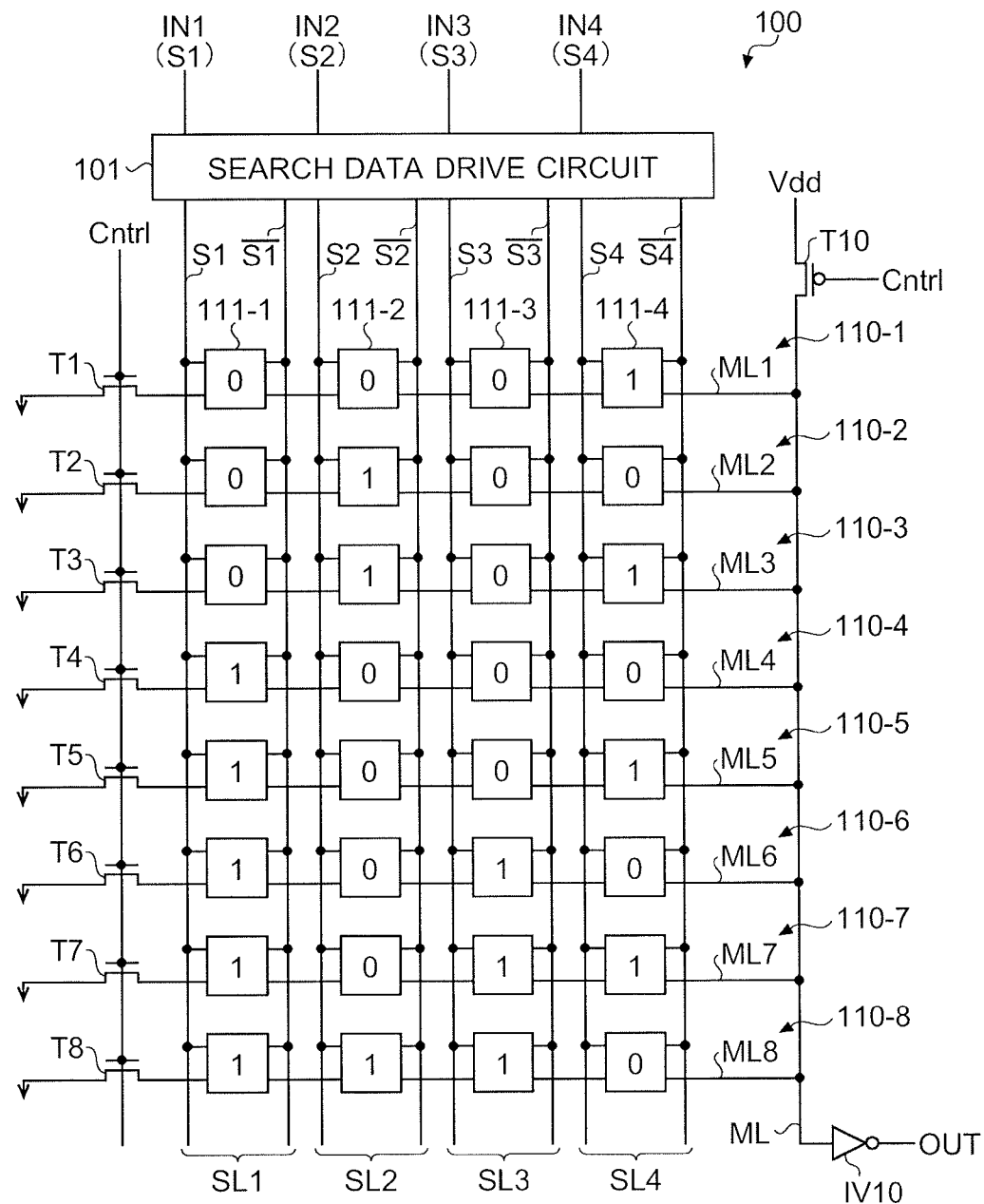
FIG. 8 is a diagram showing a state in which the truth table shown in FIG. 7 is registered in the LUT circuit shown in FIG. 1.
Figure 9:
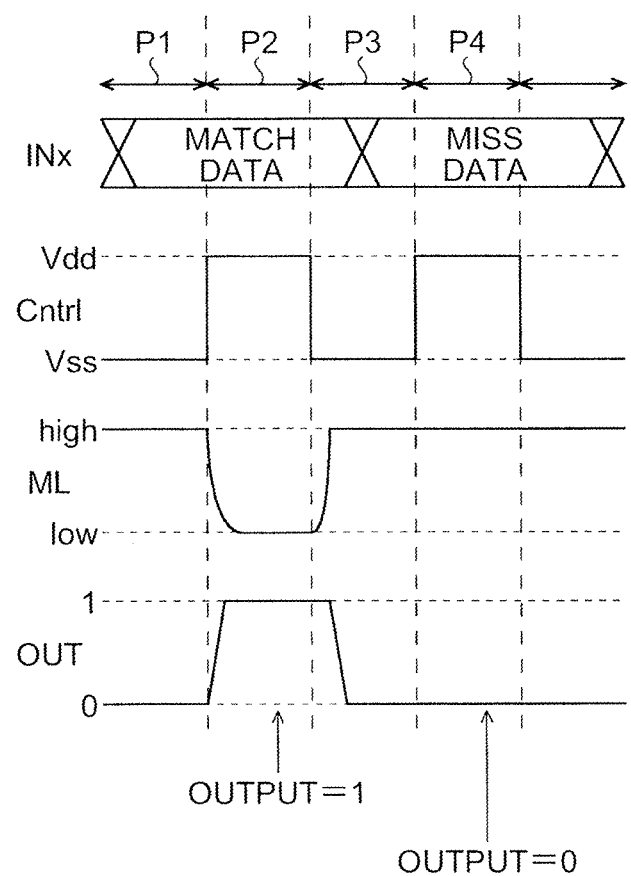
FIG. 9 is a timing chart showing an operation of the LUT circuit shown in FIG. 1.

Next, the operation of the LUT circuit 100 shown in FIG. 1 will be described in detail with accompanying drawings. FIG. 7 is a diagram showing a 4-input 1-output truth table and a method for storing the truth table in the LUT circuit. FIG. 8 shows a state in which the truth table shown in FIG. 7 is registered in the LUT circuit 100 shown in FIG. 1. FIG. 9 shows a timing chart showing the operation of the LUT circuit 100 shown in FIG. 1.

As shown in FIG. 7, in the 4-input 1-output truth table, there are sixteen ways for combinations CASE# of four input bits IN1 to IN4 (input bit string), and for all the combinations, arbitrary output bit value (OUT) is set. In the first embodiment, those input bit strings that output logic '1' are stored in the LUT circuit 100 of FIG. 1. That is, as shown in FIG. 8, the input bits IN1 to IN4 of CASE #2, #5, #6, #9, #10, #11, #12 and #15 are stored in the respective single-bit comparators 111-$x$ of the bit-string comparator 110-$x$. In the LUT circuit 100 of FIG. 1, it is possible to store input bit strings that output logic '0' instead of the input bit strings that output logic '1'. In this case, an inverted output /OUT can be obtained.

As shown in FIG. 9, during a period P1, the control voltage Cntrl inputted to the gate of the pre-charge transistor T10 is a ground voltage Vss. Therefore, the pre-charge transistor T10 structured with a p-channel FET (field effect transistor) becomes a conduction state (ON-state), and the line of the supply voltage Vdd and the common matching line ML get shorted with each other. As a result, the common matching line ML is pre-charged to a high level. As illustrated in FIG. 8, during the operation of the LUT circuit 100, one terminal of the matching line MLx of each bit-string comparator 110-$x$ is electrically connected to a ground line via the switching transistor Tx. The control voltage Cntrl is also inputted to the gate of the switching transistor Tx in each bit-string comparator 110-$x$. Such structure is for letting the pre-charge of the common matching line ML performed more surely. However, the switching transistors Tx are not requisite structures.

During a period P2, the control voltage Cntrl becomes the supply voltage Vdd, and the pre-charge transistor T10 becomes a shut-off state (OFF-state). As a result, the line of the supply voltage Vdd and the common matching line ML will get electrically separated from each other. Here, it is assumed that an input bit string that outputs logic '1' in the truth table of FIG. 7 is inputted to the LUT circuit 100 during the period P2. In this case, the bit-string comparator 110-$x$ in which the input bit strings and storage data are matched becomes the matching state, and the matching line MLx thereof becomes conducted. As a result, the common matching line ML gets shorted with the ground line, and charge accumulated in the common matching line ML will be discharged. Thereby, the common matching line ML becomes a low level. The output inverter IV10 outputs a high level (logic '1') because the low level is inputted to the input terminal thereof.

During a period P3, the control voltage Cntrl becomes the ground voltage Vss again, and the common matching line ML is pre-charged. After that, during a period P4, the control voltage Cntrl becomes Vdd, and thereby, the pre-charge transistor T10 turns off, and the line of the supply voltage Vdd and the common matching line ML will be electrically separated from each other. Here, it is assumed that an input bit string that outputs logic '0' in the truth table of FIG. 7 is inputted to the LUT circuit 100 during the period P4. In this case, all the single-bit comparators 110-$x$ become the miss-matching state. As a result, because the common matching line ML will be electrically separated from the ground line, a potential of the common matching line ML maintains at the high level. The output inverter IV10 outputs a low level (logic '0') because a high level is inputted to the input terminal thereof.

As described above, the LUT circuit 100 shown in FIG. 8 realizes the truth table of FIG. 7. In other words, the LUT circuit 100 shown in FIG. 8 outputs logic '1' when the input bit string corresponding to logic '1' in the truth table of FIG. 7 is inputted, and outputs logic '0' when the input bit string corresponding to logic '0' in the truth table of FIG. 7 is inputted.

Next, a reduced expression method used for storing the truth table data in the LUT circuit 100 in the first embodiment will be described. It is possible to reduce the number of necessary bit-string comparators 110-$x$ by using the reduced expression method.

In the reduced expression method, a pair of input bit strings with hamming distance being 1 among the input bit strings that output logic '1' in an arbitrary N-input 1-output truth table can be expressed by one reduced bit string in which a miss-matching bit between the both strings is replaced with the don't-care bit X. The reduced expression bit string is stored in each single-bit comparator 111-$x$ of the bit-string comparator 110-$x$.

Here, the hamming distance is defined as a sum of the number of miss-matching bits between two bit strings. For example, in bit strings '0001' and '0000', the fourth bits are mismatched, and thus the hamming distance therebetween is '1'. For example, in bit strings '0010' and '0001', the third bits and fourth bits are mismatched, and thus the hamming distance therebetween is '2'.

In the following explanation, the number of input bits in a N-input 1-output truth table is defined as N.sub.in. In such case, the number of input-bit-string patterns (N.sub.input) becomes 2.sup.Nin. The number of input bit strings of which outputs become logic '1' among the input bit strings is defined as N.sub.out1, and the number of input bit strings of which outputs become logic '0' among the input bit strings is defined as N.sub.out0.

Figures 10, 11:
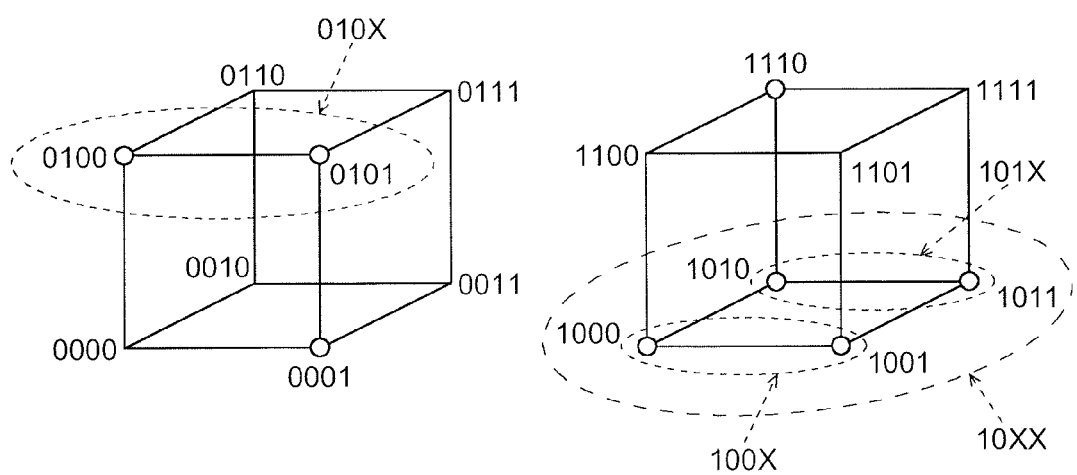
FIG. 10 is a diagram showing an example of a 4-input 1-output truth table and a method for storing the truth table in the LUT circuit using a reduced expression.
FIG. 11 is a diagram (hamming diagram) diagrammatically expressing the truth table of FIG. 10.

FIG. 10 is a diagram showing an example of a 4-input 1-output truth table and a method for storing the truth table in the LUT circuit using a reduced expression. In the truth table shown in FIG. 10 where the number of input bits N.sub.in is four, the number of input-bit-string patterns N.sub.input is sixteen, and the number of input bit strings N.sub.out1 of which outputs become logic '1' is eight. In this case, if the reduced expression method is not used, at least eight bit-string comparators 110-$x$ are necessary.

FIG. 11 is a diagram (hamming diagram) diagrammatically expressing the truth table of FIG. 10. In FIG. 11, the input bit strings are expressed as vertexes of a cube, and those input bit strings of which output becomes logic '1' thereamong are expressed as open circles. The hamming distance between two input bit strings can be expressed by a sum of the sides that connect the vertexes to which the two input bit strings are assigned in the shortest way.

When the reduced expression method is used, input bit strings '0100' and '0101' can be expressed as '010X' because the hamming distance therebetween is '1'. Likewise, input bit strings '1000' and '1001' can be expressed as '100X' and input bit strings '1010' and '1011' can be expressed as '101X', respectively. Furthermore, bit strings '100X' and '101X' can be expressed as '10XX'. Accordingly, in the case where the reduced expression method is used, input bit strings to be registered in the bit-string comparators 110-$x$ will be four bit strings; '0001', '010X', '10XX' and '1110'. As a result, the number of necessary bit-string comparators 110-$x$ becomes four. As described above, it is possible to reduce the number of necessary bit-string comparators 110-$x$ by using the reduced expression method.

Next, a minimum necessary number (N.sub.comp.sup.min) for the number of the bit-string comparators 110-$x$ (N.comp) in the LUT circuit 100 of FIG. 1 will be described. As described above, in the N-input 1-output truth table, the number of input-bit-string patterns (N.sub.input) becomes 2.sup.Nin. Accordingly, if the reduced expression method is not used, it is necessary for the LUT circuit 100 of FIG. 1 to have at least 2.sup.Nin number of bit-string comparators 110-$x$. This means that the minimum necessary number N.sub.comp.sup.min is 2.sup.Nin. On the other hand, in the case where the reduced expression method is used, the minimum necessary number N.sub.comp.sup.min becomes 2.sup.Nin*(½).

In the truth table where the number of input bits is N.sub.in, a maximum element number in a class of input bit strings of which hamming distance becomes two or greater is 2.sup.Nin*(½). When all outputs therefrom are logic '1', the minimum necessary number N.sub.comp.sup.min becomes 2.sup.Nin*(½).

Here, even if the number of input bit strings of which outputs are logic '1' increases, there is always an input bit string of which hamming distance will be 1 with respect to the increased input bit string. Therefore, by using the reduced expression method, it is possible to express the pair of input bit strings between which hamming distance is 1 as one input bit string using the don't-care bit X. Accordingly, the minimum necessary number N.sub.comp.sup.min does not increase. As described above, by using the reduced expression method, it is possible to maintain the minimum necessary number N.sub.comp.sup.min to 2.sup.Nin*(½).

Figures 12, 13:
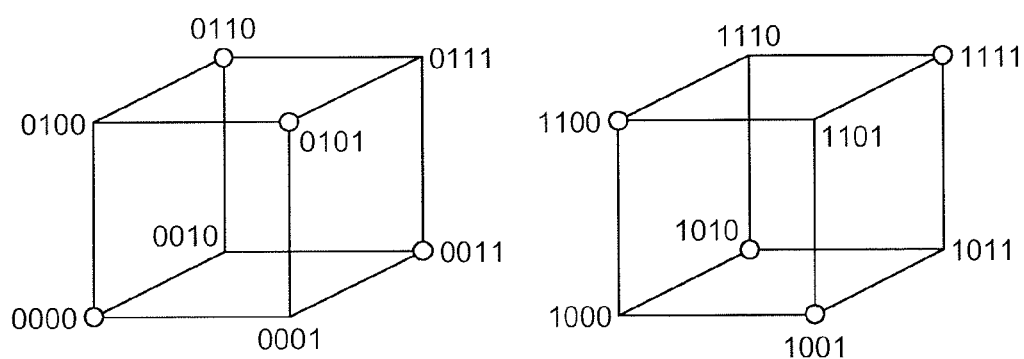
FIG. 12 is a diagram showing an example of a 4-input 1-output truth table.
FIG. 13 is diagram (hamming diagram) diagrammatically expressing the truth table of FIG. 12.

This example is shown in FIG. 12. FIG. 12 shows an example of a 4-input 1-output truth table. FIG. 13 is diagram (hamming diagram) diagrammatically expressing the truth table of FIG. 12. The number of input-bit-string patterns 2.sup.Nin is 16. Among these input bit strings, the input bit strings of which outputs become logic '1' are '0000', '0011', '0101', '0110', '1001', '1010', '1100' and '1111', and thus the number of input bit strings N.sub.out1 with the outputs being logic '1' is 8. As it is apparent from FIG. 13, each hamming distance between these input bit strings is two or greater. In such case, since it is impossible to use the reduced expression, the minimum necessary number N.sub.comp.sup.min becomes 8.

Here, even if the number of input bit strings of which outputs are logic '1' increases, as being apparent from FIG. 13, there is always an input bit strings of which hamming distance will be 1 with respect to the increased input bit string. Therefore, by using the reduced expression method, it is possible to maintain the minimum necessary number N.sub.comp.sup.min to 8.

Figure 14:
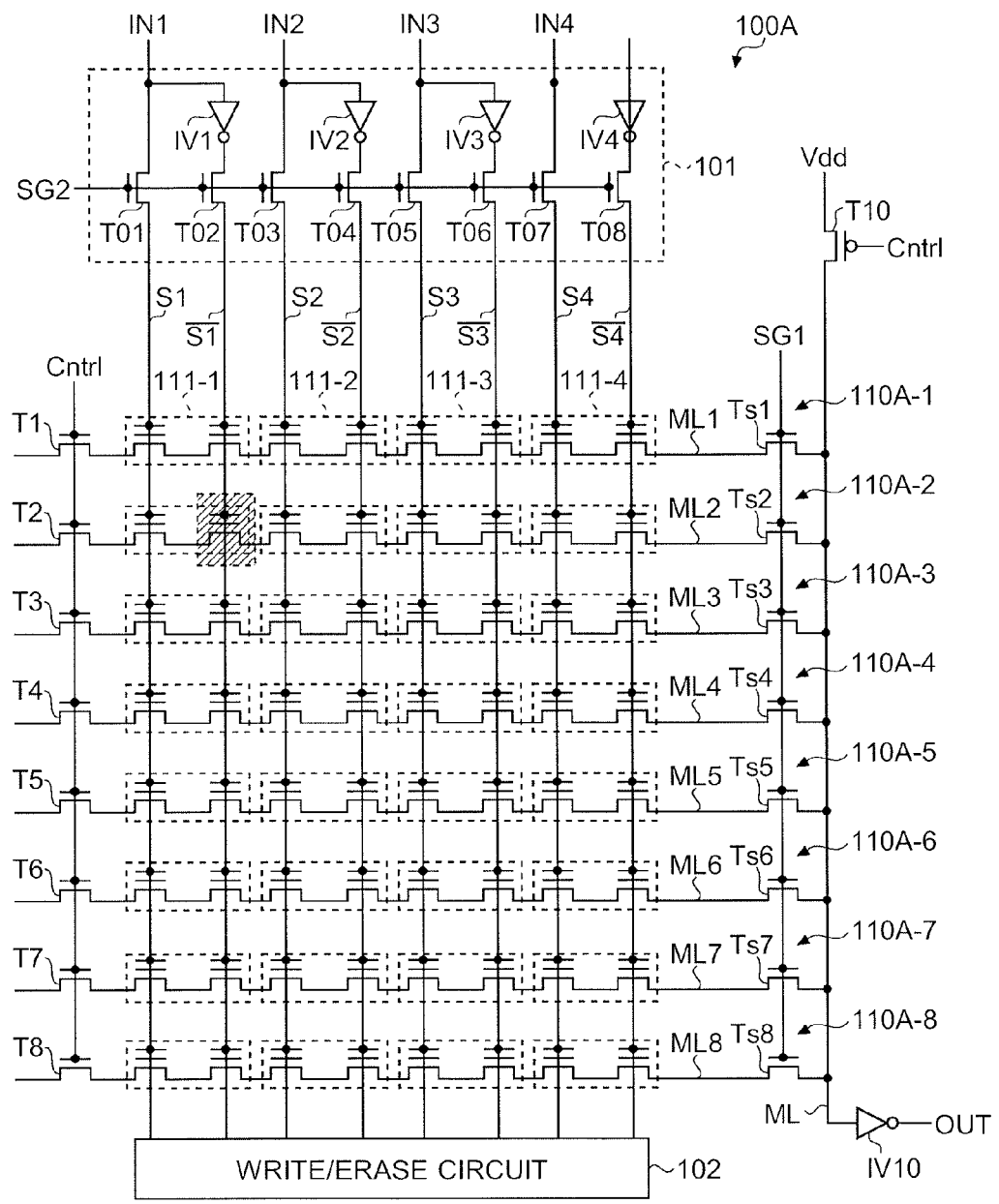
FIG. 14 is a circuit diagram showing an example of the LUT circuit as structured using the single-bit comparators of FIG. 2.

FIG. 14 shows an example of the LUT circuit as structured using the single-bit comparators of FIG. 2. As shown in FIG. 14, a LUT circuit 100A has a write/erase circuit 102 in addition to the same structure as the LUT circuit 100 shown in FIG. 1. The search data drive circuit 101, for instance, has cutoff transistors T01 to T08 connected to the search lines Sx and the inverted search lines /Sx, and inverters IVx (x is one of integers 1 to 4) to inverse the input bits INx to be inputted to the inverted search lines /Sx.

In the LUT circuit 100A, the bit-string comparators 110-$x$ are replaced with bit-string comparators 110A-x (x is one of integers 1 to 8). Each bit-string comparator 110A-x has a cutoff transistor Tsx (x is one of integers 1 to 8) located between each matching line MLx and the common matching line ML in addition to the same structure as the bit-string comparators 110-$x$.

Figure 15:
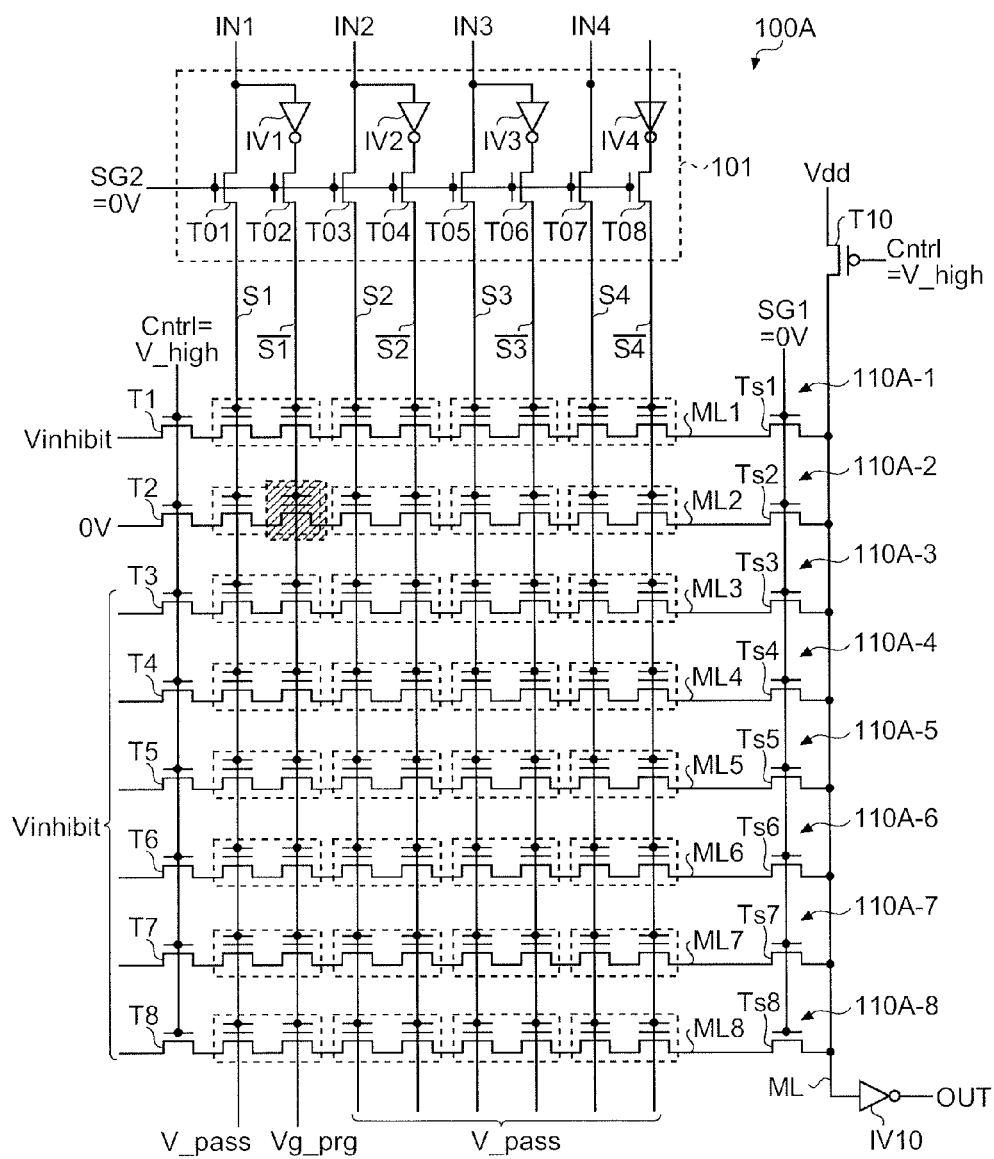
FIG. 15 is a diagram for explaining a writing procedure for writing the storage data in the LUT circuit.

Next, a writing procedure for writing the storage data in the LUT circuit 100A shown in FIG. 14 will be described. FIG. 15 is a diagram for explaining a writing procedure for writing the storage data in the LUT circuit 100A. As shown in FIG. 15, in the writing procedure for writing the storage data in the LUT circuit 100A, firstly, a voltage (0V, for instance) being equal to or lower than the threshold voltage Vth is applied to gates of the cutoff transistors Tsx in order to make the cutoff transistors Tsx become the off states. Next, while a writing gate voltage is applied to a search line Sx or an inverted search line /Sx (hereinafter to be referred to as a selected search line Sx or /Sx) which is connected to a gate of a writing target non-volatile memory transistor M1 or M2 (hereinafter to be referred to as a selected memory transistor M1 or M2), a writing drain voltage is applied to a matching line MLx (hereinafter to be referred to as a selected matching line MLx) which is connected to the selected memory transistor M1 or M2. On the other hand, while a non-writing gate voltage which is lower than the writing gate voltage is applied to a search line Sx or an inverted search line /Sx (hereinafter to be referred to as a non-selected search line Sx or /Sx) which is not connected to the selected memory transistor M1 or M2, a write-inhibiting drain voltage is applied to a matching line MLx (hereinafter to be referred to as a non-selected matching line MLx) which is not connected to the selected memory transistor M1 or M2. Here, the non-writing gate voltage is lower than the writing gate voltage, and the write-inhibiting drain voltage is lower than the non-writing gate voltage. Moreover, the writing drain voltage is lower than the write-inhibiting drain voltage.

For instance, a gate writing voltage Vg_prg (+18V, for instance) is applied to the selected search line Sx or /Sx as the writing gate voltage, and the transfer voltage V_pass (+10V, for instance) is applied to the non-selected search line Sx or /Sx as the non-writing gate voltage. To the selected matching line MLx, 0V is applied as the writing drain voltage. Thereby, the storage data is written in the selected memory transistor M1 or M2 by the FN (Fowler-Nordheim) tunnel current. As a result, the threshold voltage Vth of the selected memory transistor M1 or M2 increases. On the other hand, an inhibition voltage Vinhibit (+6V, for instance) is applied to the non-selected matching line MLx as the write-inhibiting drain voltage. Thereby, the writing of the storage data to the non-selected memory transistor M1 or M2 is inhibited.

In order to electrically separate the matching line MLx from the common matching line ML at a time of writing to the selected memory transistor M1 or M2, the cutoff transistor Tsx which functions as a selecting gate is necessary. To a gate of the cutoff transistor Tsx, a cut-off voltage SG1 (0V, for instance) is applied in time with the writing. In the example shown in FIG. 15, the cutoff transistors T01 to T08 each of which functions as a selecting gate are arranged on the search lines Sx and the inverted search lines /Sx. To gates of the cutoff transistors T01 to T08, a cut-off voltage SG2 (0V, for instance) is applied in time with the writing as necessary. Thereby, it is possible to electrically separate external circuits leading to input lines connected to the search data drive circuit 101 from the search lines Sx and the inverted search lines /Sx, and to prevent the external circuits from breaking down by the gate writing voltage Vg_prg or the transfer voltage V_pass. However, the cutoff transistors T01 to T08 are not necessary needed. If the external circuits leading to the input lines are structured using high voltage transistors, for instance, it is possible to omit the cutoff transistors T01 to T08.

As described above, according to the LUT circuits 100 and 100A of the first embodiment, the single-bit comparators 111-$x$ can function as both the configuration memories and the selection circuits. As a result, with the LUT circuit of the first embodiment, as compared with the conventional LUT circuit which requires both of the configuration memories and the selection circuits, it is possible to downsize a footprint area of the circuit.

Moreover, in the LUT circuit 100 according to the first embodiment, it is possible to reduce the number of transistors through which signal passes from the time the search data is inputted to the time the output is fixed. Thereby, it is possible to reduce signal delay.

Furthermore, when the non-volatile memory transistors M1 and M2 are used for the single-bit comparators 111-$x$ (see the LUT circuit 100A shown in FIG. 14), for instance, configuration data is stored in the non-volatile memory transistor M1 or M2. Therefore, it is possible to apply a technique in that power supply is shut off during standby (power gating). As a result, it is possible to achieve the low-power consuming LUT circuit 100A.

Second Embodiment

Figure 16:
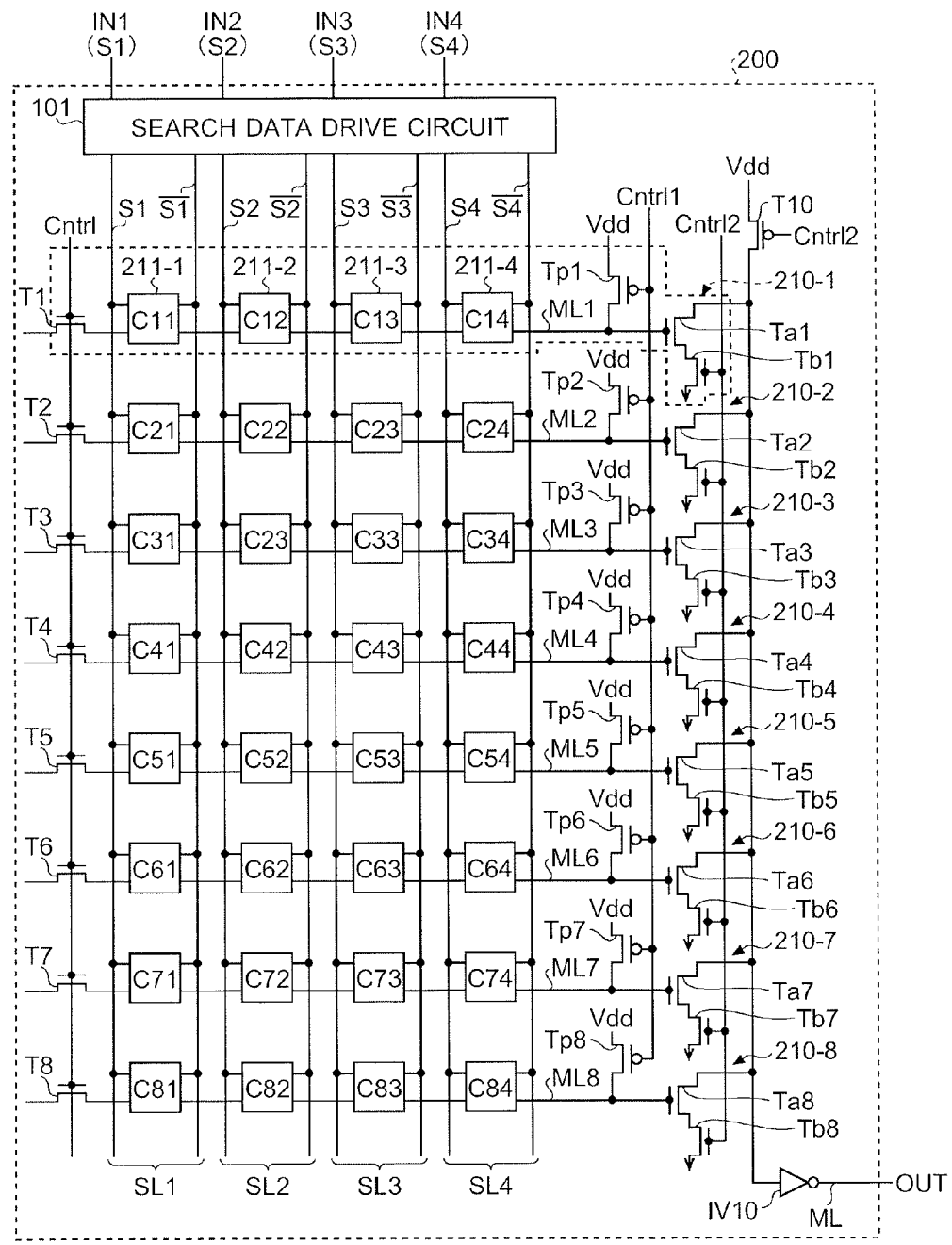
FIG. 16 is a circuit diagram showing an outline structure of a LUT circuit according to a second embodiment.

Next, a LUT circuit according to a second embodiment will be described with reference to the accompanying drawings. In the first embodiment, the case where the bit-string comparators 110-$x$ are structured with the NAND-type single-bit comparators 111-$x$ have been described. In the second embodiment, a case where the bit-string comparators are structured with NOR-type single-bit comparators will be described. FIG. 16 is a circuit diagram showing an outline structure of a LUT circuit according to a second embodiment. In the following, as for the same structures as the above-described embodiment, the same reference numbers will be assigned and the redundant explanations thereof will be omitted.

As shown in FIG. 16, a LUT circuit 200 according to the second embodiment has the same structure as the LUT circuit 100 shown in FIG. 1 except that the bit-string comparators 110-$x$ are replaced with bit-string comparators 210-$x$ ($x$ is one of integers 1 to 8). Each bit-string comparator 210-$x$ has a NOR-type single-bit comparator 211-$x$ ($x$ is one of integers 1 to 4) instead of the NAND-type single-bit comparator 111-$x$. Like the single-bit comparator 111-$x$, the single-bit comparator 211-$x$ has the first and second input terminals and the first and second match-determination terminals.

Each bit-string comparator 210-$x$ has a p-type pre-charge transistor Tpx ($x$ is one of integers 1 to 8) of which drain is connected to the matching line MLx. To a gate of the pre-charge transistor Tpx, a control voltage Cntrl1 for controlling current entry from the line of the supply voltage Vdd, for instance, is applied. Furthermore, the bit-string comparator 210-$x$ has a n-type transistor Tax ($x$ is one of integers 1 to 8) connected between the matching line MLx and the common matching line ML, and a n-type transistor Tbx ($x$ is one of integers 1 to 8) connected between a source of the transistor Tax and the ground line. Each matching line MLx is connected to a gate of the respective transistor Tax. A drain of the transistor Tax is connected to the common matching line ML. To a gate of the transistor Tbx, a control voltage Cntrl2 is applied. The rest of the structure can be the same as the LUT circuit 100 or 100A shown in FIG. 1 or FIG. 14.

Figure 17:
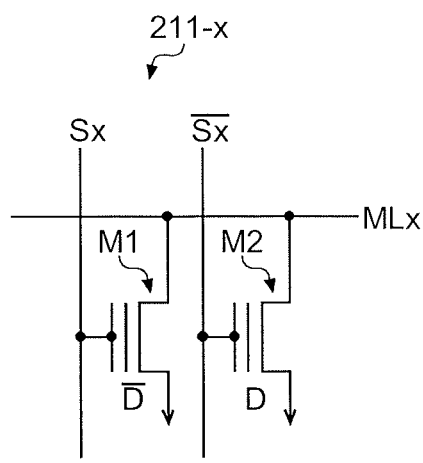
FIG. 17 is a circuit diagram showing an example of a single-bit comparator shown in FIG. 16.

One example of the single-bit comparator 211-$x$ shown in FIG. 16 is shown in FIG. 17. In FIG. 17, a NOR-type single-bit comparator 211-$x$ is shown. As shown in FIG. 17, the single-bit comparator 211-$x$ has a structure in that two non-volatile memory transistors M1 and M2 are connected between the matching line MLx and the ground line in parallel. A gate of the non-volatile memory transistor M1 is connected to the first input terminal, and a gate of the non-volatile memory transistor M2 is connected to the second input terminal. Drains of the non-volatile memory transistors M1 and M2 are connected to the matching line MLx, and sources of the non-volatile memory transistors M1 and M2 are connected to the ground line.

Figure 18:
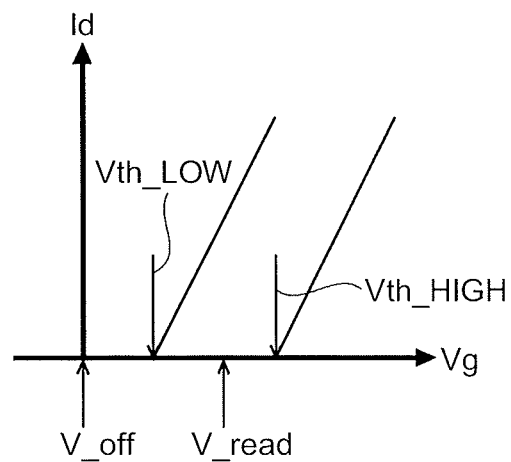
FIG. 18 is a diagram showing a relationship between a voltage value of search data to be supplied to the single-bit comparator of FIG. 17 and a voltage value (threshold) of storage data stored in a non-volatile memory transistor.

Here, the operation of the single-bit comparator 211-$x$ shown in FIG. 17 will be described. FIG. 18 shows a relationship between a voltage value of the search data S and /S to be supplied to the single-bit comparator of FIG. 17 and a voltage value (threshold) of the storage data D and /D stored in a non-volatile memory transistors M1 and M2. FIG. 19 shows a combination example of the search data S and /S to be supplied to each search line pair SLx. FIG. 20 shows a combination example of the storage data D and /D stored in the non-volatile memory transistors M1 and M2. FIG. 21 shows states of the non-volatile memory transistors M1 and M2 in response to the search data and the storage data.

As shown in FIG. 18, a threshold voltage Vth (corresponding to the storage data) in an erased state of the non-volatile memory transistor is defined as a first threshold voltage Vth_LOW, a threshold voltage Vth (corresponding to the storage data) in a written state of the non-volatile memory transistor is defined as a second threshold voltage Vth_HIGH, a voltage being lower than the first threshold voltage Vth_LOW is defined as an off voltage V_off, and a voltage being higher than the first threshold voltage Vth_LOW and being lower than the second voltage Vth_HIGH is defined as a readout voltage V_read. The non-volatile memory transistor becomes a conduction state (ON-state) when search data with a voltage value being higher than a voltage value (threshold) of the storage data being stored therein is applied to the gate thereof.

Here, as for the NOR-type single-bit comparator 211-$x$ shown in FIG. 17, a combination of the search data S and /S to be applied to the search line pairs SLx is set as a combination shown in FIG. 19, and a combination of the storage data D and /D to be stored in the non-volatile memory transistors M2 and M1 is set as a combination shown in FIG. 20.

Specifically, firstly, as shown in FIG. 19, applied voltages to the search line Sx and the inverted search line /Sx (corresponding to the search data S and /S) are respectively set as the readout voltage V_read and the off voltage V_off when the search data (input bit value) is '0', and are respectively set as the off voltage V_off and the readout voltage V_read when the search data (input bit value) is '1'. Moreover, when the search data (input bit value) is the mask bit MASK, both of the applied voltage to the search line Sx and the inverted search line /Sx are set as the off voltage V_off.

As shown in FIG. 20, the storage data D and /D to be stored in the single-bit comparator 211-$x$ are respectively set as the first threshold voltage Vth_LOW and the second threshold voltage Vth_HIGH when the storage data is '0', and are respectively set as the second threshold voltage Vth_HIGH and the first threshold voltage Vth_LOW when the storage data is '1'. When the storage data is a don't-care bit X, both of the storage data D and /D to be stored in the single-bit comparator 211-$x$ are set as the second threshold voltage Vth_HIGH.

In this way, as shown in FIG. 21, it is possible to achieve the operation of the single-bit comparator 211-$x$ in accordance with the combinations of the search data and the storage data. That is, when the combination of the search data and the storage data is a combination of '0' and '1' or a combination of '1' and '0', either the non-volatile memory transistor M1 or M2 becomes a conduction state (ON-state). As a result, the matching line MLx will get electrically shorted with the ground line. This state is a miss-matching state in the operation of matching determination. On the other hand, in the other cases, the non-volatile memory transistors M1 and M2 become a shut-off state (OFF-state). As a result, the matching line MLx and the ground line will get electrically separated from each other. This state is a matching state in the operation of matching determination.

As shown in 'MASK' of FIG. 21, the single-bit comparator 211-x connected to the search line pair SLx to which mask bit MASK has been applied as the search data determines the state as the matching state with respect to all combinations. Furthermore, as shown in 'X' of FIG. 21, the single-bit comparator 211-x storing the don't-care bit X as the storage data determines the state as the matching state with respect to all combinations.

Figure 23:
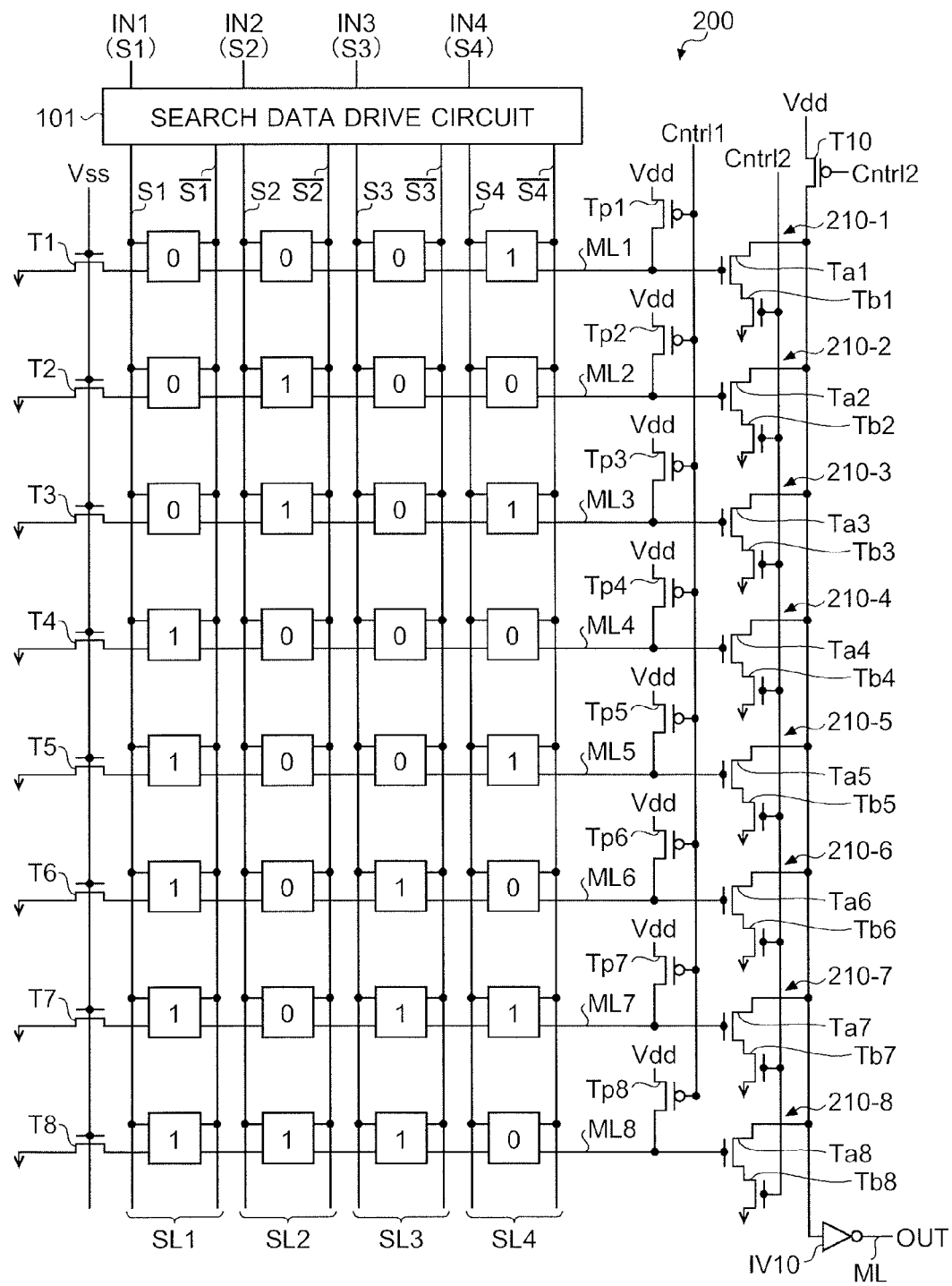
FIG. 23 is a diagram showing a state in which the truth table shown in FIG. 22 is registered in the LUT circuit shown in FIG. 16.
Figure 24:
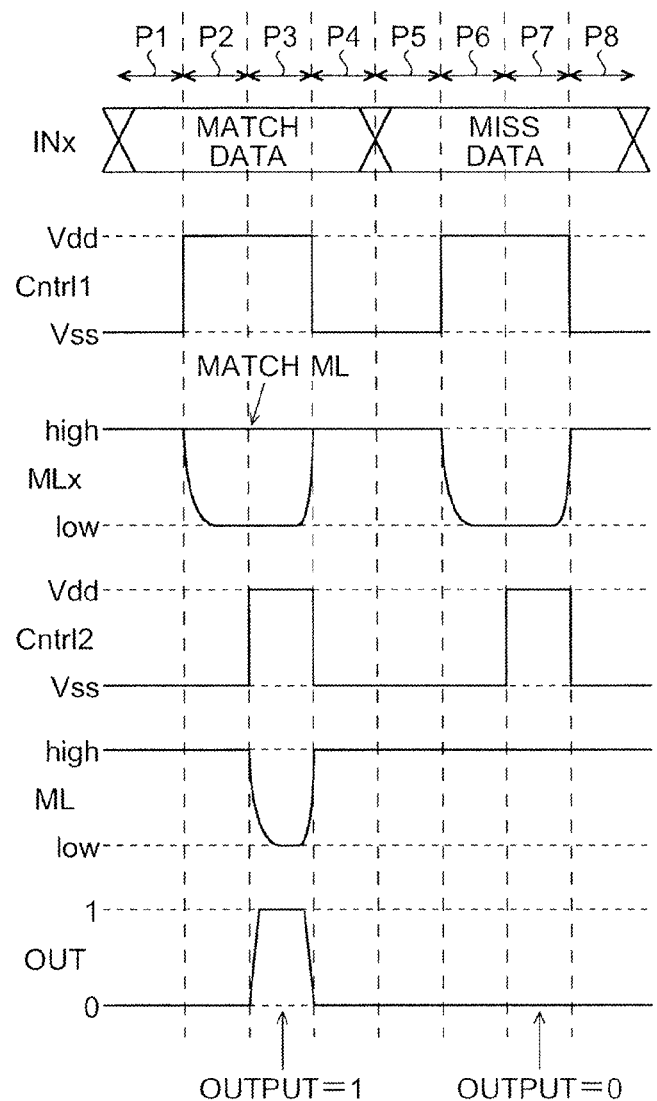
FIG. 24 is a timing chart showing an operation of the LUT circuit shown in FIG. 16.

Next, the operation of the LUT circuit 200 shown in FIG. 16 will be described in detail with accompanying drawings. FIG. 22 is a diagram showing a 4-input 1-output truth table and a method for storing the truth table in the LUT circuit. FIG. 23 shows a state in which the truth table shown in FIG. 22 is registered in the LUT circuit 200 shown in FIG. 16. FIG. 24 shows the operation of the LUT circuit 200 shown in FIG. 16.

As shown in FIG. 22, in the 4-input 1-output truth table, there are sixteen ways for combinations CASE# of four input bits IN1 to IN4 (input bit string), and for all the combinations, arbitrary output bit value (OUT) is set. In the second embodiment, those input bit strings that output logic '1' among these combinations are stored in the LUT circuit 200 of FIG. 16. That is, as shown in FIG. 23, the input bits IN1 to IN4 of CASE #2, #5, #6, #9, #10, #11, #12 and #15 are stored in the respective single-bit comparators 211-x of the bit-string comparator 210-x. In the LUT circuit 200, it is possible to store input bit strings that output logic '0' instead of the input bit strings that output logic '1'. In this case, an inverted output /OUT can be obtained.

As shown in FIG. 24, during a period P1, the control voltage Cntrl1 is the ground voltage Vss. Therefore, the pre-charge transistor Tpx structured with a p-channel FET becomes a conduction state (ON-state), and the line of the supply voltage Vdd and the matching line MLx get shorted with each other. As a result, the matching line MLx is pre-charged to a high level. In FIG. 23, the ground voltage Vss is constantly applied to the gate of the switching transistor Tx connected to each matching line MLx during the operation of the LUT circuit 200. However, such structure is for letting the pre-charge of the matching lines performed more surely, and it is not a requisite structure.

During the period P1, the control voltage Cntrl2 is the ground voltage Vss. Therefore, the pre-charge transistor T10 structured with a p-channel FET becomes a conduction state (ON-state), and the transistors Tbx structured with n-channel FETs become a shut-off state (OFF-state). As a result, the common matching line ML is pre-charged to a high level.

During a period P2, the control voltage Cntrl1 becomes the supply voltage Vdd, and the pre-charge transistor Tpx becomes a shut-off state (OFF-state). Thereby, the line of the supply voltage Vdd and the matching line MLx will get electrically separated from each other. Here, it is assumed that an input bit string that outputs logic '1' in the truth table of FIG. 22 is inputted to the LUT circuit 200 during the period P2. In this case, the bit-string comparator 210-x in which the input bit string and storage data are matched becomes the matching state, and the high level of the matching line MLx is maintained. On the other hand, the bit-string comparator 210-x in which the input bit string and storage data are miss-matched becomes the miss-matching state, and charge accumulated in the matching line MLx will be discharged. Thereby, the matching lines MLx with the miss-matching state become a low level.

During a period P3, the control voltage Cntrl2 becomes the supply voltage Vdd, and the pre-charge transistor T10 becomes a shut-off state (OFF-state). As a result, the line of the supply voltage Vdd and the matching line MLx will get electrically separated from each other. Furthermore, due to the control voltage Cntrl2 becoming the supply voltage Vdd, the transistor Tbx becomes a conduction state (ON-state). During the period P3, the transistor Tax of the bit-string comparator 210-x at the matching state is at the conduction state (ON-state). Accordingly, the common matching line ML gets shorted with the ground line, and charge accumulated in the common matching line ML will be discharged. Thereby, the common matching line ML becomes a low level. The output inverter IV10 outputs a high level (logic '1') because the low level is inputted to the input terminal thereof.

During periods P4 and P5, the control voltages Cntrl1 and Cntrl2 become the ground voltage Vss again, and the matching line MLx and the common matching line ML are pre-charged.

During a period P6, the control voltage Cntrl1 becomes the supply voltage Vdd, and the pre-charge transistor Tpx becomes a shut-off state (OFF-state). As a result, the line of the supply voltage Vdd and the matching line MLx will get electrically separated from each other. Here, it is assumed that an input bit string that outputs logic '0' in the truth table of FIG. 22 is inputted to the LUT circuit 200 during the period P6. In this case, the bit-string comparator 210-x in which the input bit strings and storage data are miss-matched becomes the miss-matching state, and charge accumulated in the matching line MLx will be discharged. As a result, the matching lines MLx with the miss-matching state become a low level. During the period P6, all bit-string comparators 210-x will be at the miss-matching state, and all matching lines MLx will become the low level.

During a period P7, the control voltage Cntrl2 becomes the supply voltage Vdd, and the pre-charge transistor T10 becomes a shut-off state (OFF-state). Thereby, the line of the supply voltage Vdd and the common matching line ML will get electrically separated from each other. Furthermore, due to the control voltage Cntrl2 becoming the supply voltage Vdd, the transistor Tbx becomes the conduction state (ON-state). During the period P7, because all the matching lines MLx are at the low level, all the transistors Tax are at the shut off state (OFF-state). Accordingly, the common matching line ML gets electrically separated from the ground line, and the common matching line ML maintains the high level. The output inverter IV10 outputs a low level (logic '0') because the high level is inputted to the input terminal thereof.

As described above, the LUT circuit 200 shown in FIG. 23 realizes the truth table of FIG. 22. In other words, the LUT circuit 200 shown in FIG. 23 outputs logic '1' when the input bit string corresponding to logic '1' in the truth table of FIG. 22 is inputted, and outputs logic '0' when the input bit string corresponding to logic '0' in the truth table of FIG. 22 is inputted.

Figure 25:
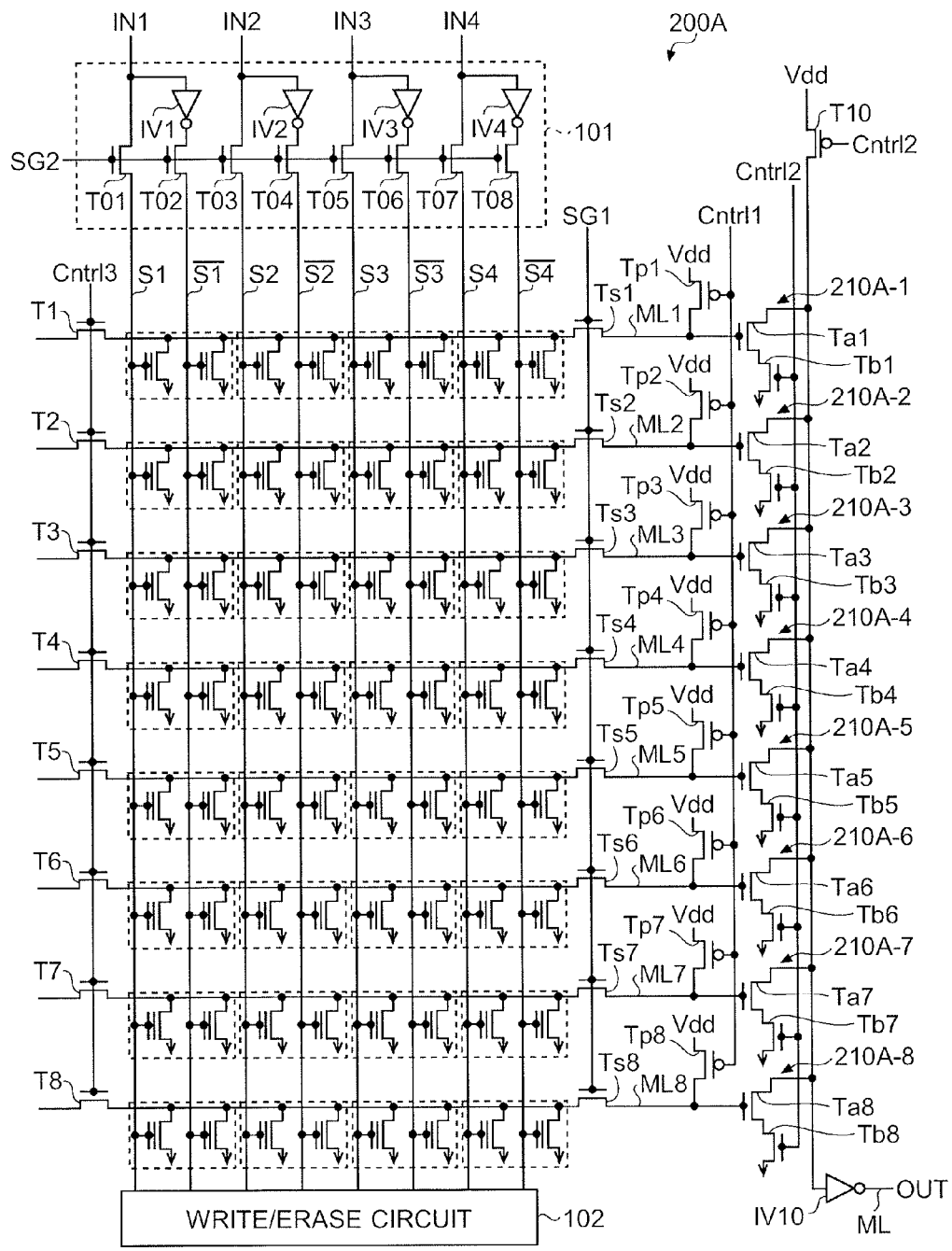
FIG. 25 is a circuit diagram showing an example of the LUT circuit as structured using the single-bit comparator of FIG. 17.

FIG. 25 shows an example of a LUT circuit 200A as structured using the single-bit comparator 211-x of FIG. 17. As shown in FIG. 25, the LUT circuit 200A has a write/erase circuit 102 in addition to the same structure as the LUT circuit 200 shown in FIG. 16.

In the LUT circuit 200A, the bit-string comparators 210-x are replaced with bit-string comparators 210A-x (x is one of integers 1 to 8). Each bit-string comparator 210A-x has a cutoff transistor Tsx (x is one of integers 1 to 8) located between each matching line MLx and the common matching line ML in addition to the same structure as the bit-string comparators 210-x.

Figure 26:
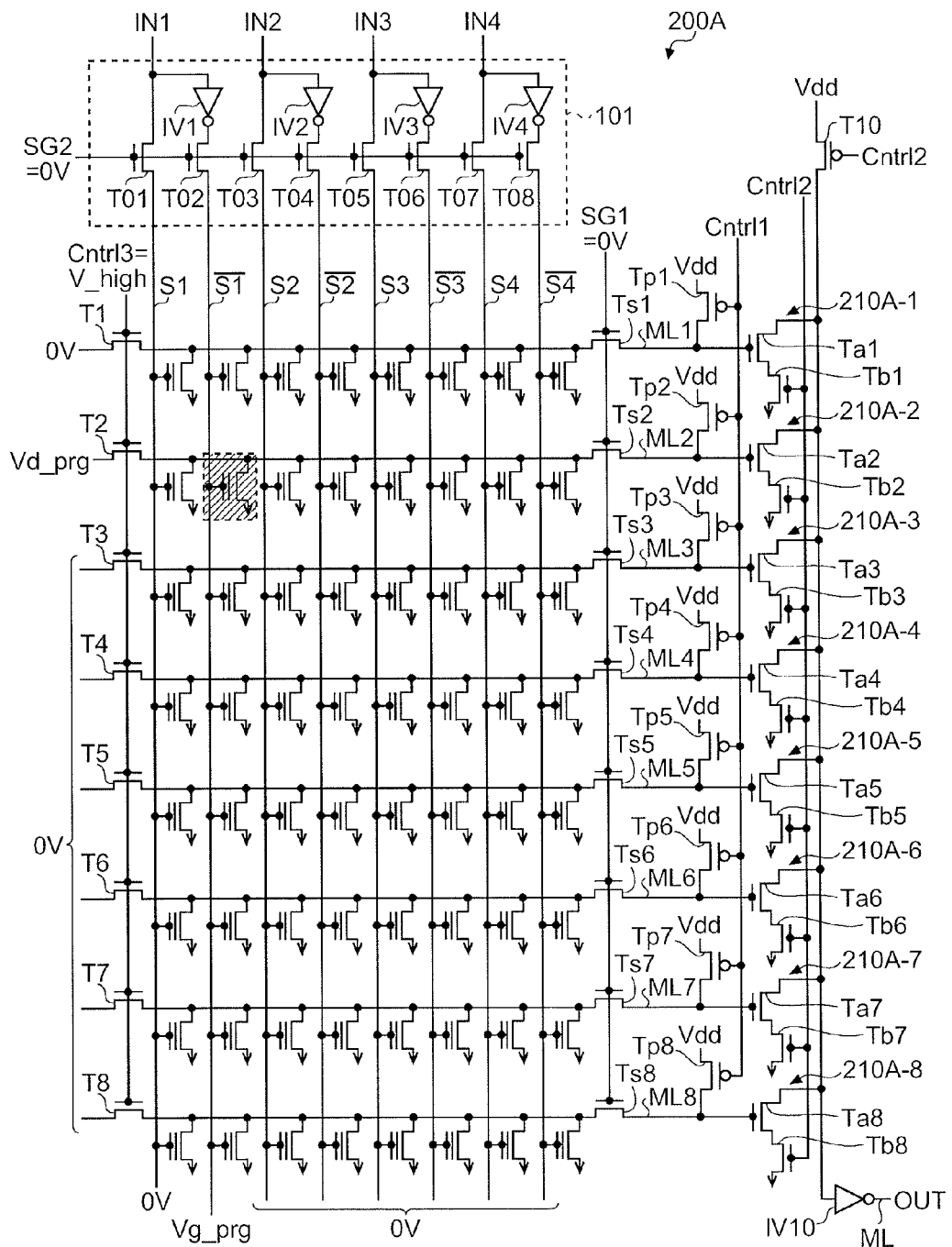
FIG. 26 is a diagram for explaining a writing procedure for writing the storage data in the LUT circuit.

Next, a writing procedure for writing the storage data in the LUT circuit 200A shown in FIG. 25 will be described. FIG. 26 is a diagram for explaining a writing procedure for writing the storage data in the LUT circuit 200A. As shown in FIG. 26, in the writing procedure for writing the storage data in the LUT circuit 200A, firstly, a voltage (0V, for instance) being equal to or lower than the threshold voltage Vth is applied to gates of the cutoff transistors Tsx in order to make the cutoff transistors Tsx become the off states. Next, while a writing gate voltage is applied to a selected search line Sx or /Sx which is connected to a gate of a selected memory transistor M1 or M2, a writing drain voltage is applied to a selected matching line MLx which is connected to a drain of the selected memory transistor M1 or M2. On the other hand, while a non-writing gate voltage which is lower than the writing gate voltage is applied to a non-selected search line Sx or /Sx which is not connected to the selected memory transistor M1 or M2, a non-writing drain voltage is applied to a non-selected matching line MLx which is not connected to the selected memory transistor M1 or M2.

For instance, a gate writing voltage Vg_prg (+10V, for instance) is applied to the selected search line Sx or /Sx as the writing gate voltage, and 0V is applied to the non-selected search line Sx or /Sx as the non-writing gate voltage. To the selected matching line MLx which is connected to the selected memory transistor M1 or M2, a drain writing voltage Vd_prg (+3V, for instance) is applied as the writing drain voltage. To the non-selected matching line MLx, 0V is applied as the non-writing drain voltage. Thereby, the storage data is written in the selected memory transistor M1 or M2 by the CHE (channel hot electron) injection. As a result, the threshold voltage Vth of the selected memory transistor M1 or M2 increases.

In the example shown in FIG. 26, the cutoff transistor Tsx is arranged at the matching line MLx. The cutoff transistors Tsx shut off the drain writing voltage Vd_prg during the writing operation in order to protect the transistors Tax and the pre-charge transistors Tpx. However, the cutoff transistors Tsx are not necessary needed. If the transistors Tax and the pre-charge transistors Tpx are structured using high voltage transistors, for instance, it is possible to omit the cutoff transistors Tsx.

As described above, according to the LUT circuits 200 and 200A of the second embodiment, it is possible to obtain the same effects as the first embodiment.

Third Embodiment

Next, a LUT circuit according to a third embodiment will be described with reference to the accompanying drawings. In the third embodiment, other structures of the single-bit comparator 111-x or 211-x in the same structure as the above-described LUT circuit 100, 100A, 200 or 200A will be described with several examples. In the following, as for the same structures as the above-described embodiments, the same reference numbers will be assigned and the redundant explanations thereof will be omitted.

Figure 27:
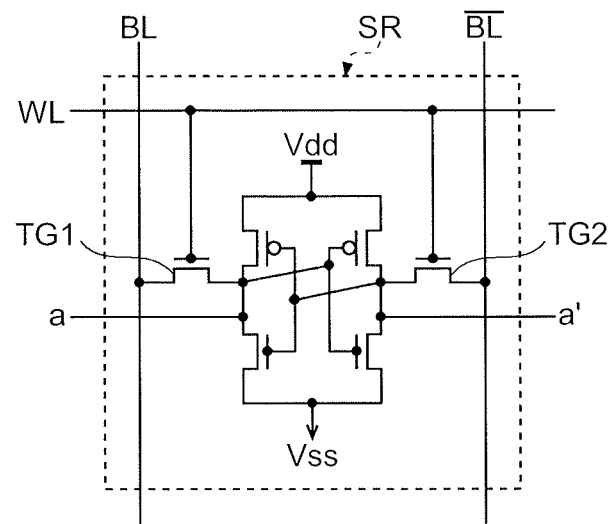
FIG. 27 is a circuit diagram showing a basic structure of a SRAM cell.
Figure 28:
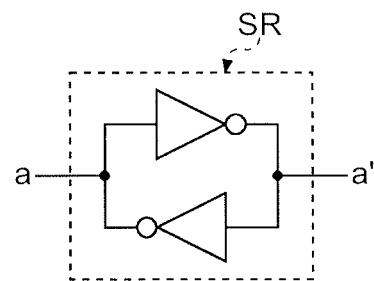
FIG. 28 is a simplified schematic diagram of the SRAM cell shown in FIG. 27.

In the following, a SRAM cell SR having the structure shown in FIG. 27 will be shown as a simplified structure shown in FIG. 28. FIG. 27 is a circuit diagram showing a conventional structure of a SRAM cell. In FIG. 28, among the circuit structures in FIG. 27, transfer gates TG1 and TG2, the data lines BL and /BL, and the control line WL will be omitted.

/First Example (Ternary Single-Bit Comparator with NOR-Type Matching Line and SRAM)

Figure 29:
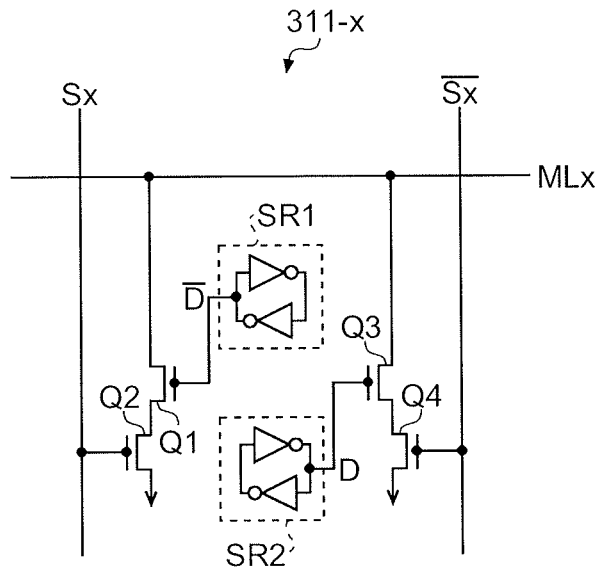
FIG. 29 is a circuit diagram showing a first example of a single-bit comparator according to a third embodiment.

FIG. 29 is a circuit diagram showing a first example of a single-bit comparator according to a third embodiment. The single-bit comparator 311-x (x is one of integers 1 to 4) shown in FIG. 29 is a ternary single-bit comparator structured with a NOR-type matching line and SRAMs (static random access memory). The ternary single-bit comparator is a comparator which can store three values of logic '0', '1' and 'X'.

Like the above-described single-bit comparator 111-x or 211-x, the single-bit comparator 311-x has the first input terminal connected to the search line Sx and the second input terminal connected to the inverted search line /Sx, and the first and second match-determination terminals respectively connected to the matching line MLx.

The single-bit comparator 311-x, as shown in FIG. 29, has SRAM cells SR1 and SR2 each of which includes a flip-flop circuit, four switching transistors Q1 to Q4, and an internal signal line connecting the first and second match-determination terminals. The switching transistor Q1 has a gate connected to a data terminal of the SRAM cell SR1, a drain connected to the internal signal line, and a source connected to a drain of the switching transistor Q2. The switching transistor Q2 has a gate connected to the first input terminal, and a source connected to the ground line.

Likewise, the switching transistor Q3 has a gate connected to a data terminal of the SRAM cell SR2, a drain connected to the internal signal line, and a source connected to a drain of the switching transistor Q4. The switching transistor Q4 has a gate connected to the second input terminal, and a source connected to the ground line.

/Second Example (Binary Single-Bit Comparator with NOR-Type Matching Line and SRAM)

Figure 30:
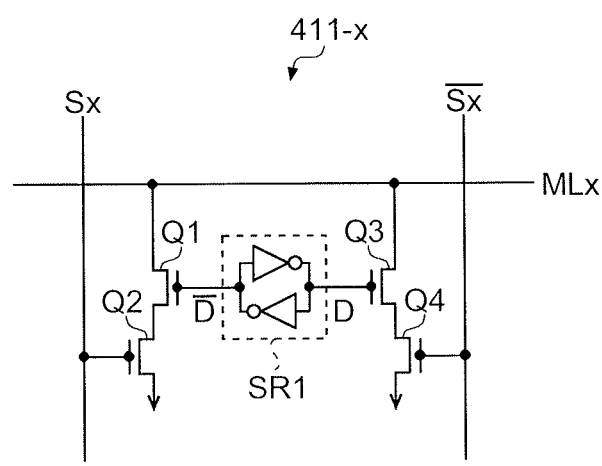
FIG. 30 is a circuit diagram showing a second example of the single-bit comparator according to the third embodiment.

FIG. 30 is a circuit diagram showing a second example of the single-bit comparator according to the third embodiment. The single-bit comparator 411-x (x is one of integers 1 to 4) shown in FIG. 30 is a binary single-bit comparator structured with a NOR-type matching line and a SRAM. The binary single-bit comparator is a comparator which can store two values of logic '0' and '1'.

Like the above-described single-bit comparator 111-x, 211-x or 311-x, the single-bit comparator 411-x has the first input terminal connected to the search line Sx and the second input terminal connected to the inverted search line /Sx, and the first and second match-determination terminals respectively connected to the matching line MLx.

The single-bit comparator 411-x, as shown in FIG. 30, has the SRAM cell SR1, the switching transistors Q1 to Q4, and the internal signal line connecting the first and second match-determination terminals. The switching transistor Q1 has a gate connected to an inverted data terminal of the SRAM SR1, a drain connected to the internal signal line, and a source connected to a drain of the switching transistor Q2. The switching transistor Q2 has a gate connected to the first input terminal, and a source connected to the ground line.

Likewise, the switching transistor Q3 has a gate connected to a data terminal of the SRAM cell SR1, a drain connected to the internal signal line, and a source connected to a drain of the switching transistor Q4. The switching transistor Q4 has a gate connected to the second input terminal, and a source connected to the ground line.

The single-bit comparators 311-x and 411-x having the NOR-type matching line MLx and the SRAM cell SR1 (and SR2), as described above, can be applied to the LUT circuit 200 shown in FIG. 16. The single-bit comparators 311-x and 411-x is structured with MOS (metal-oxide-silicon) transistors. Conventionally, a MOS transistor has a switching speed higher than that of a non-volatile memory transistor. Therefore, by using the single-bit comparator 311-x or 411-x, it is possible to realize a higher speed LUT circuit.

/Third Example (Ternary Single-Bit Comparator with NAND-Type Matching Line and SRAM)

Figure 31:
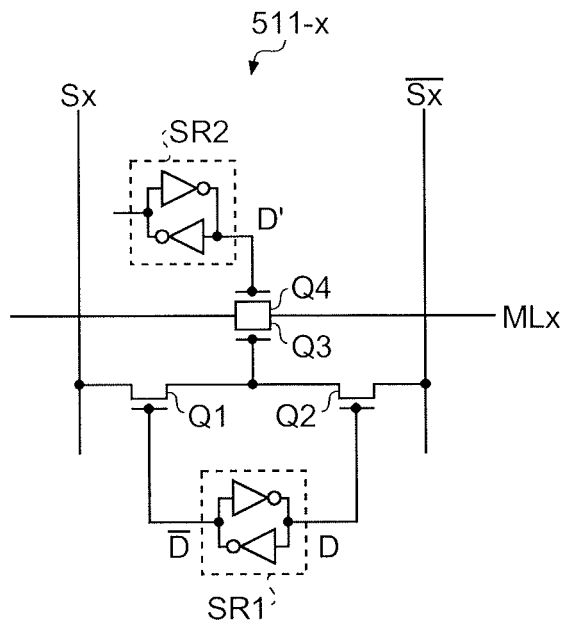
FIG. 31 is a circuit diagram showing a third example of the single-bit comparator according to the third embodiment.

FIG. 31 is a circuit diagram showing a third example of the single-bit comparator according to the third embodiment. The single-bit comparator 511-x (x is one of integers 1 to 4) shown in FIG. 31 is a ternary single-bit comparator structured with a NAND-type matching line and SRAMs.

Like the above-described single-bit comparator 111-x, 211-x, 311-x or 411-x, the single-bit comparator 511-x has the first input terminal connected to the search line Sx and the second input terminal connected to the inverted search line /Sx, and the first and second match-determination terminals respectively connected to the matching line MLx.

The single-bit comparator 511-x, as shown in FIG. 31, has the SRAM cells SR1 and SR2, the switching transistors Q1 to Q4, and the internal signal line connecting a drain of the switching transistor Q1 and a source of the switching transistor Q2. The switching transistor Q1 has a gate connected to an inverted data terminal of the SRAM cell SR1, and a source connected to the first input terminal. The switching transistor Q2 has a gate connected to a data terminal of the SRAM cell SR1, and a drain connected to the second input terminal. The switching transistor Q3 has a gate connected to the internal signal line, a source connected to the first match-determination terminal, and a drain connected to the second match-determination terminal. The switching transistor Q4 has a gate connected to a data terminal of the SRAM cell SR2, a source connected to the first match-determination terminal, and a drain connected to the second match-determination terminal.

/Fourth Example (Binary Single-Bit Comparator with NAND-Type Matching Line and SRAM)

Figure 32:
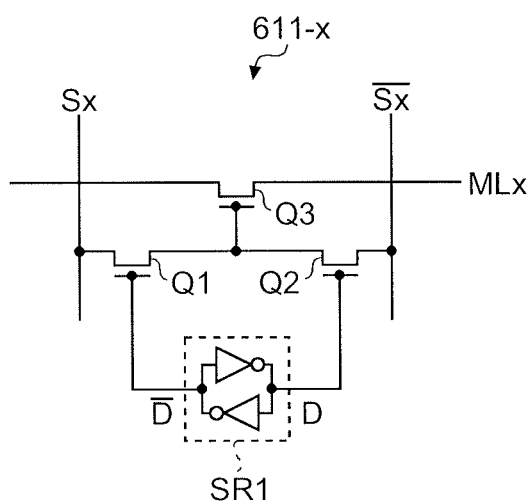
FIG. 32 is a circuit diagram showing a fourth example of the single-bit comparator according to the third embodiment.

FIG. 32 is a circuit diagram showing a fourth example of the single-bit comparator according to the third embodiment. The single-bit comparator 611-x (x is one of integers 1 to 4) shown in FIG. 32 is a binary single-bit comparator structured with a NAND-type matching line and a SRAM.

Like the above-described single-bit comparator 111-x, 211-x, 311-x, 411-x or 511-x, the single-bit comparator 611-x has the first input terminal connected to the search line Sx and the second input terminal connected to the inverted search line /Sx, and the first and second match-determination terminals respectively connected to the matching line MLx.

The single-bit comparator 611-x, as shown in FIG. 32, has the SRAM cell SR1, the switching transistors Q1 to Q3, and the internal signal line connecting a drain of the switching transistor Q1 and a source of the switching transistor Q2. The switching transistor Q1 has a gate connected to an inverted data terminal of the SRAM cell SR1, and a source connected to the first input terminal. The switching transistor Q2 has a gate connected to a data terminal of the SRAM cell SR1, and a drain connected to the second input terminal. The switching transistor Q3 has a gate connected to the internal signal line, a source connected to the first match-determination terminal, and a drain connected to the second match-determination terminal.

The single-bit comparators 511-x and 611-x having the NOR-type matching line MLx and the SRAM cell SR1 (and SR2), as described above, can be applied to the LUT circuit 100 shown in FIG. 1. Thereby, it is possible to realize a higher speed LUT circuit.

Fourth Embodiment

Figure 33:
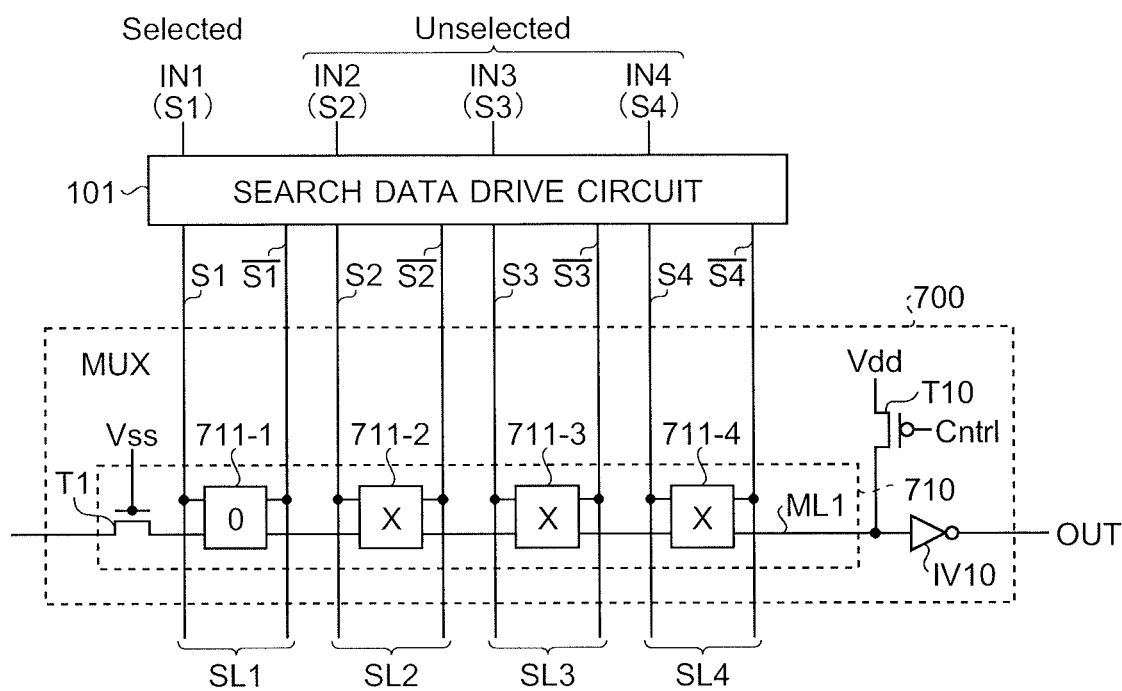
FIG. 33 is a circuit diagram showing an outline structure of a MUX circuit according to a fourth embodiment.

Next, a MUX circuit according to a fourth embodiment will be described with reference to the accompanying drawings. In the fourth embodiment, a MUX circuit structured with cells having NOR-type matching lines will be shown. FIG. 33 is a circuit diagram showing an outline structure of a 4-input 1-output MUX circuit according to a fourth embodiment. In the following, as for the same structures as the above-described embodiments, the same reference numbers will be assigned and the redundant explanations thereof will be omitted.

As shown in FIG. 33, the MUX circuit 700 has bit-string comparators 710 of which structure is the same as the bit-string comparator 110, a plurality of search line pairs SLx (x is one of integers 1 to 4), a common matching line ML, a pre-charge transistor T10, and an output inverter IV10. Furthermore, the MUX circuit 700 is connected to the search data drive circuit 101 via the search line pairs SLx.

The bit-string comparator 710 has single-bit comparators 711-x (x is one of integers 1 to 4) of which number corresponds to the number of input bits, a NOR-type matching line ML1, and a switching transistor T1 for controlling current from the matching line ML1. Each single-bit comparator 711-x is structured with a ternary single-bit comparator having a NOR-type matching line such as the single-bit comparator 211-x shown in FIG. 17, 311-x shown in FIG. 29, or the like.

The MUX circuit 700 of FIG. 33 shows an example in which it is programmed that an input signal line (input bit IN1) corresponding to the search line pair SL1 is selected and the input bit IN1 inputted to this input signal line is outputted. In order to output the input bit IN1, logic '0' is to be stored in the single-bit comparator 711-1 connected to the search line pair SL1 that corresponds to the selected input signal line, and logic 'X' is to be stored in the remaining single-bit comparators 711-2 to 711-4.

Figure 34:
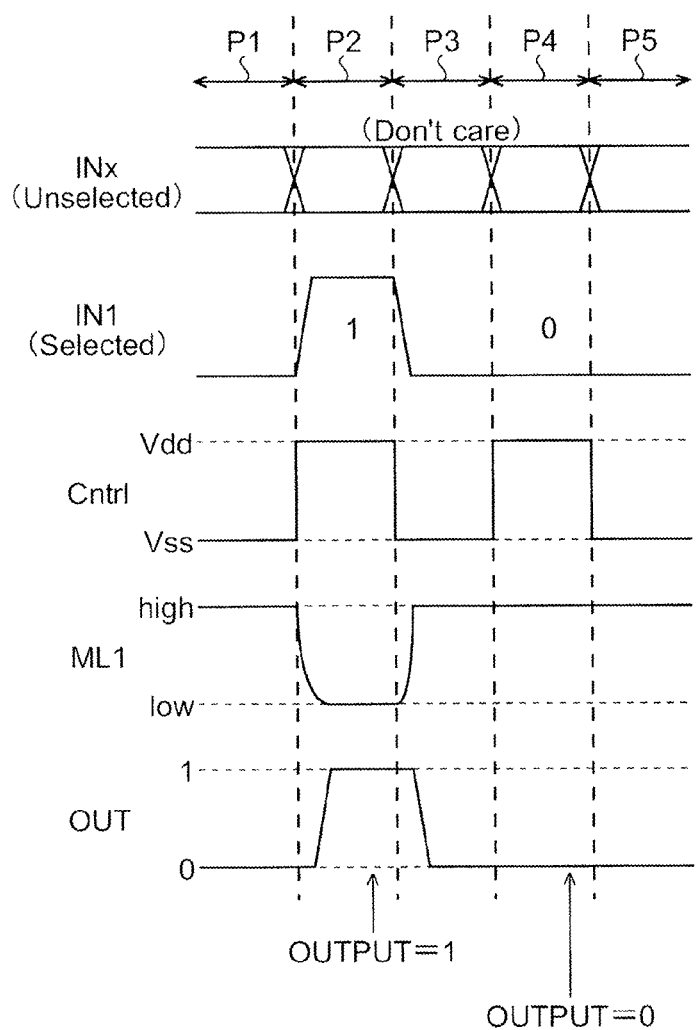
FIG. 34 is a timing chart showing an operation of the MUX circuit shown in FIG. 33.

FIG. 34 is a timing chart showing the operation of the MUX circuit 700 shown in FIG. 33. As shown in FIG. 34, during a period P1, the control voltage Cntrl is a ground voltage Vss. Therefore, the pre-charge transistor T10 structured with a p-channel FET becomes a conduction state (ON-state), and the line of the supply voltage Vdd and the matching line ML1 get shorted with each other. As a result, the matching line ML1 is pre-charged to a high level. During the operation of the LUT circuit 700, the ground voltage Vss is constantly applied to the gate of the switching transistor T1 connected to the matching line ML1. Therefore, the transistor T1 becomes a shut-off state (OFF-state) during the operation of the MUX circuit 700.

During a period P2, the control voltage Cntrl becomes the supply voltage Vdd, and the pre-charge transistor T10 becomes a shut-off state (OFF-state). Thereby, the line of the supply voltage Vdd and the matching line ML1 will get electrically separated from each other. Here, it is assumed that logic '1' is inputted to the search line pair SL1 that corresponds to the selected input signal line (input bit IN1) during the period P2. In this case, because the single-bit comparator 711-x connected to the search line pair SL1 becomes the miss-matching state, the matching line ML1 gets shorted with the ground line, and charge accumulated in the matching line ML1 will be discharged. Thereby, the matching line ML1 becomes a low level. The output inverter IV10 outputs a high level (logic '1') because the low level is inputted to the input terminal thereof.

During period P3, the control voltage Cntrl becomes the ground voltage Vss again, and the matching line ML1 is pre-charged.

During a period P4, the control voltage Cntrl becomes the supply voltage Vdd, and the pre-charge transistor T10 becomes a shut-off state (OFF-state). As a result, the line of the supply voltage Vdd and the matching line ML1 will get electrically separated from each other. Here, it is assumed that logic '0' is inputted to the search line pair SL1 during the period P4. In this case, the single-bit comparator 711-1 connected to the search line pair SL1 becomes the matching state. On the other hand, because the single-bit comparators 711-2 to 711-4 connected to the search line pairs SL2 to SL4 store the don't-care bit X, they become the matching state regardless of the inputs to the search line pairs SL2 to SL4. As a result, the matching line ML1 gets electrically separated from the ground line, and the matching line ML1 maintains the high level. The output inverter IV10 outputs a low level (logic '0') because the high level is inputted to the input terminal thereof.

As described above, the MUX circuit 700 shown in FIG. 33 can realize a MUX function enabling to select and output a previously programmed input from among multiple inputs.

Figure 35:
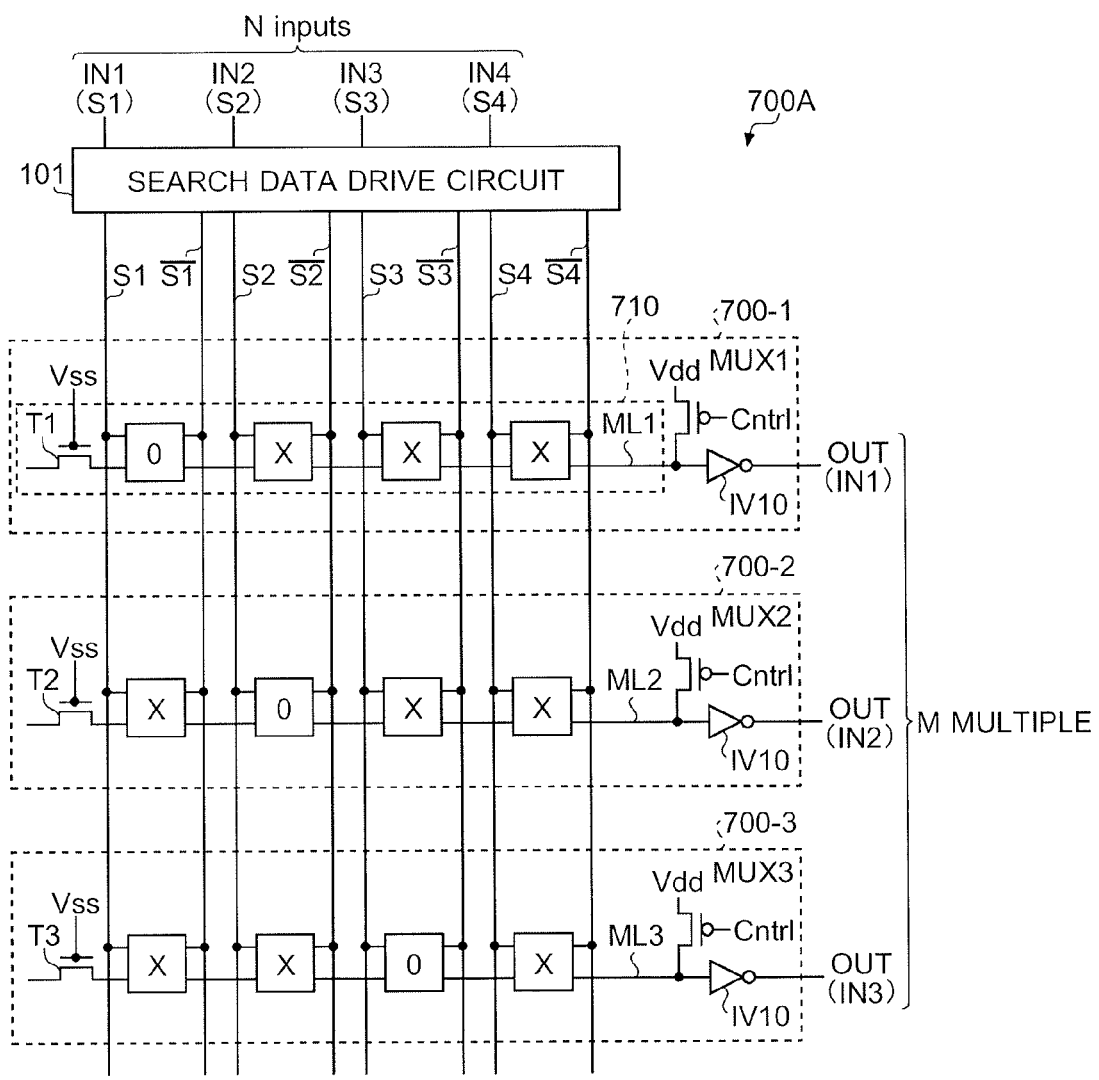
FIG. 35 is a circuit diagram showing an outline structure of a N-input M-output MUX circuit according to the fourth embodiment.

Next, a N-input M-output MUX circuit in which M (M is an Integer greater than 2) MUX circuits 700 are arranged in parallel will be described. FIG. 35 is a circuit diagram showing an outline structure of a N-input M-output MUX circuit according to the fourth embodiment.

As shown in FIG. 35, the N-input M-output MUX circuit 700A has a plurality of the MUX circuits 700-x (x is one of integers 1 to 3) each of which is the same as the MUX circuit 700 shown in FIG. 33. These MUX circuits 700-x share the same search line pairs SLx.

FIG. 35 shows an example in which it is programmed that the MUX circuits 700-1, 700-2 and 700-3 output the input bit IN1, IN2 and In3, respectively. Specifically, in the MUX circuit 700-1, the single-bit comparator 711-1 connected to the input signal line to which the input bit IN1 is to be inputted stores logic '0', and the remaining single-bit comparators 711-2 to 711-4 store logic 'X'. In the MUX circuit 700-2, the single-bit comparator 711-2 connected to the input signal line to which the input bit IN2 is to be inputted stores logic '0', and the remaining single-bit comparators 711-1, 711-3 and 711-4 store logic 'X'. In the MUX circuit 700-3, the single-bit comparator 711-3 connected to the input signal line to which the input bit IN3 is to be inputted stores logic '0', and the remaining single-bit comparators 711-1, 711-2 and 711-4 store logic 'X'.

According to the fourth embodiment, the multi-input 1-output MUX circuit and the multi-input multi-output MUX circuit each of which has the NOR-type matching line can be realized. In the MUX circuit according to the fourth embodiment, the single-bit comparators 711 can function as both the configuration memory and the selection circuit. As a result, with the MUX circuit of the fourth embodiment, as compared with the conventional MUX circuit which requires both of the configuration memory and the selection circuit, it is possible to downsize a footprint area of the circuit and reduce signal delay. When the single-bit comparator 211 which has the non-volatile memory transistor shown in FIG. 17 is used as the single-bit comparator 711, a non-volatile programmable MUX circuit can be realized. Furthermore, with the multi-input multi-output MUX circuit according to the fourth embodiment, it is possible to improve the area efficiency of the circuit because the search line pairs SLx can be shared.

Fifth Embodiment

Figure 36:
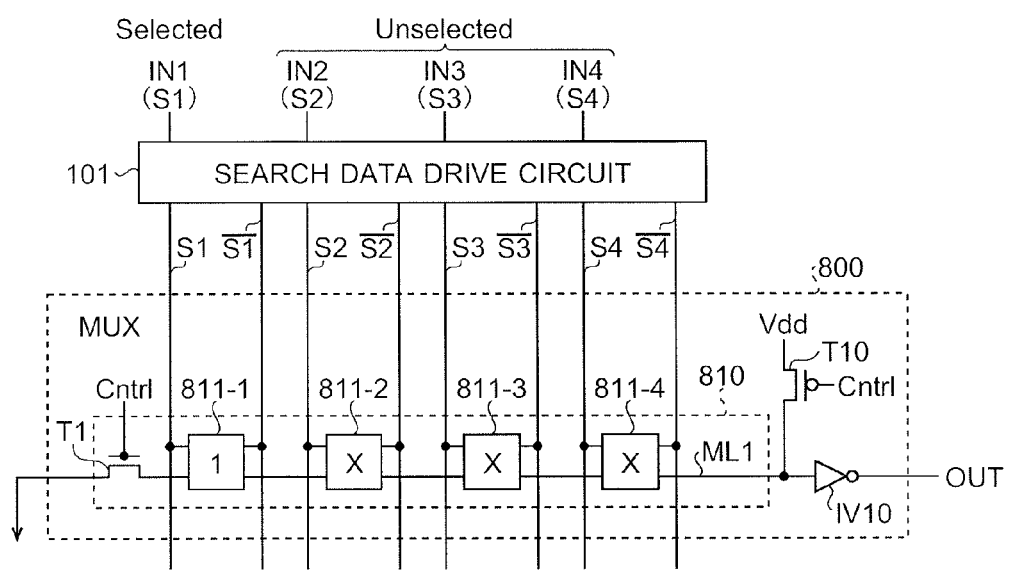
FIG. 36 is a circuit diagram showing an outline structure of a MUX circuit according to a fifth embodiment.

Next, a MUX circuit according to a fifth embodiment will be described with reference to the accompanying drawings. In the fourth embodiment, the case where the MUX circuit 700 is structured with the NOR-type bit-string comparator 710 was shown as an example. Here, in the fifth embodiment, a case where a MUX circuit is structured with a NAND-type bit-string comparator will be shown as an example. FIG. 36 is a circuit diagram showing an outline structure of a MUX circuit according to a fifth embodiment. In the following, as for the same structures as the above-described embodiments, the same reference numbers will be assigned and the redundant explanations thereof will be omitted.

As shown in FIG. 36, a MUX circuit 800 according to the fifth embodiment has the same structure as the MUX circuit 700 shown in FIG. 33 except that the bit-string comparators 710 are replaced with bit-string comparators 810. Furthermore, the MUX circuit 800 is connected to the search data drive circuit 101 via the search line pairs SLx.

The bit-string comparator 810 has single-bit comparators 811-x (x is one of integers 1 to 4) of which number corresponds to the number of input bits, a NAND-type matching line ML1, and a switching transistor T1 for controlling current from the matching line ML1. Each single-bit comparator 811-x is structured with a ternary single-bit comparator having a NAND-type matching line such as the single-bit comparator 111-x shown in FIG. 2, 511-x shown in FIG. 31, or the like.

The MUX circuit 800 of FIG. 36 shows an example in which it is programmed that an input signal line (input bit IN1) corresponding to the search line pair SL1 is selected and the input bit IN1 inputted to this input signal line is outputted. In order to output the input bit IN1, logic '1' is to be stored in the single-bit comparator 811-1 connected to the search line pair SL1 that corresponds to the selected input signal line, and logic 'X' is to be stored in the remaining single-bit comparators 811-2 to 811-4.

Figure 37:
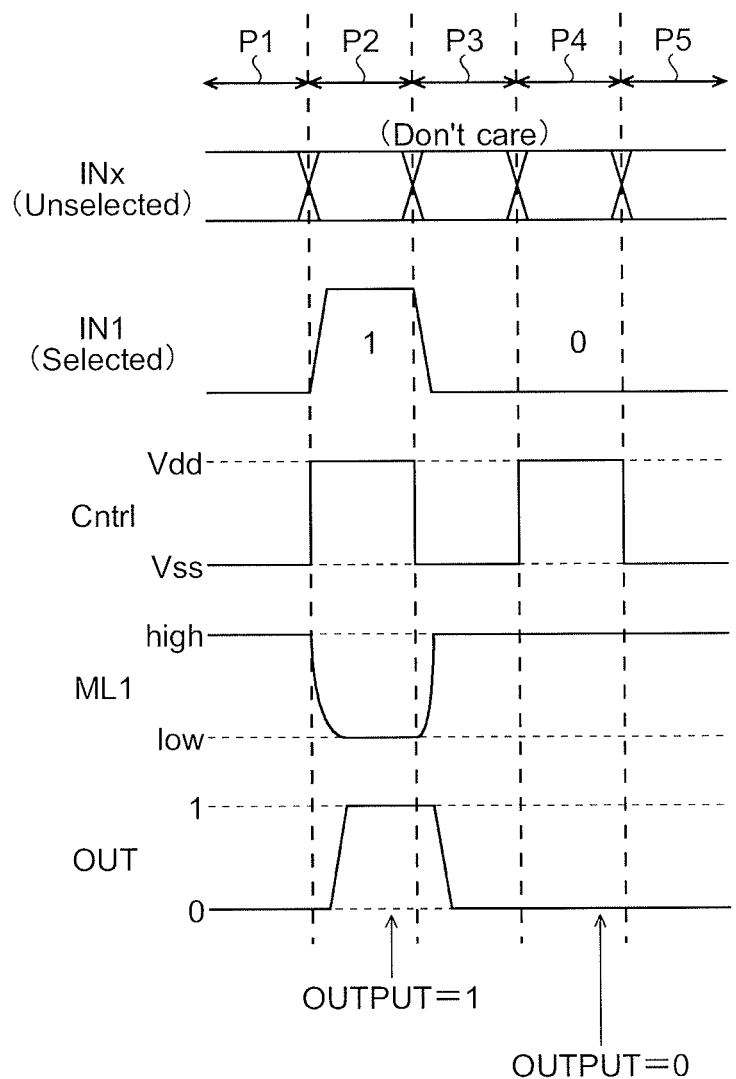
FIG. 37 is a timing chart showing an operation of the MUX circuit shown in FIG. 36.

FIG. 37 is a timing chart showing an operation of the MUX circuit shown in FIG. 36. As shown in FIG. 37, during a period P1, the control voltage Cntrl is a ground voltage Vss. Therefore, the pre-charge transistor T10 structured with a p-channel FET becomes a conduction state (ON-state), and the line of the supply voltage Vdd and the matching line ML1 get shorted with each other. As a result, the matching line ML1 is pre-charged to a high level. During the operation of the LUT circuit 800, a side of the matching line ML1 opposite to the pre-charge transistor T10 is electrically connected to the ground line. Here, to gates of the switching transistors T1 in the bit-string comparator 810, the control voltage Cntrl is inputted. However, such structure is for letting the pre-charge of the matching lines performed more surely, and it is not a requisite structure.

During a period P2, the control voltage Cntrl becomes the supply voltage Vdd, and the pre-charge transistor T10 becomes a shut-off state (OFF-state). As a result, the line of the supply voltage Vdd and the matching line ML1 will get electrically separated from each other. Here, it is assumed that logic '1' is inputted to the search line pair SL1 that corresponds to the selected input signal line (input bit IN1) during the period P2. In this case, the single-bit comparator 811-x connected to the search line pair SL1 becomes the matching state. On the other hand, because the single-bit comparators 811-2 to 811-4 connected to the search line pairs SL2 to SL4 store the don't-care bit X, they become the matching state regardless of the inputs to the search line pairs SL2 to SL4. Thereby, the matching line ML1 gets shorted with the ground line, and charge accumulated in the matching line ML1 will be discharged. As a result, the matching line ML1 becomes a low level. The output inverter IV10 outputs a high level (logic '1') because the low level is inputted to the input terminal thereof.

During period P3, the control voltage Cntrl becomes the ground voltage Vss again, and the matching line ML1 is pre-charged.

During a period P4, the control voltage Cntrl becomes the supply voltage Vdd, and the pre-charge transistor T10 becomes a shut-off state (OFF-state). As a result, the line of the supply voltage Vdd and the matching line ML1 will get electrically separated from each other. Here, it is assumed that logic '0' is inputted to the search line pair SL1 during the period P4. In this case, the single-bit comparator 811-1 connected to the search line pair SL1 becomes the miss-matching state, and the first and second match-determination terminals are electrically separated from each other. Thereby, the matching line ML1 gets electrically separated from the ground line, and the matching line ML1 maintains the high level. The output inverter IV10 outputs a low level (logic '0') because the high level is inputted to the input terminal thereof.

As described above, the MUX circuit 800 shown in FIG. 36 can realize a MUX function enabling to select and output a previously programmed input from among multiple inputs.

Also according to the fifth embodiment, as the fourth embodiment described above, by arranging the M MUX circuits 800 shown in FIG. 36 in parallel, it is possible to realize the multi-input multi-output MUX circuit. The other structures, the operations and the effects may be the same as the fourth embodiment.

Sixth Embodiment

In a reconfigurable logic circuit, a configuration data for achieving one logic is referred to as a context. In recent years, due to diversification of system, a multi-context reconfigurable logic circuit which can store a plurality of contexts and selectively realize one of a plurality of logics has been proposed. A configuration memory (multi-context memory) of a multi-context reconfigurable logic circuit has a plurality of memories, and outputs one storage data from among the plurality of the memories from a data output terminal based on a context selecting signal. In a sixth embodiment, a structure of a single-bit comparator having a multi-context memory will be described with several examples. Multi-context reconfigurable LUT circuit and MUX circuit can be realized by replacing the single-bit comparator in the above embodiments with a multi-context reconfigurable single-bit comparator which will be described below.

/First Example (Ternary Single-Bit Comparator with NOR-Type Matching Line and Multi-Context Memory)

Figure 38:
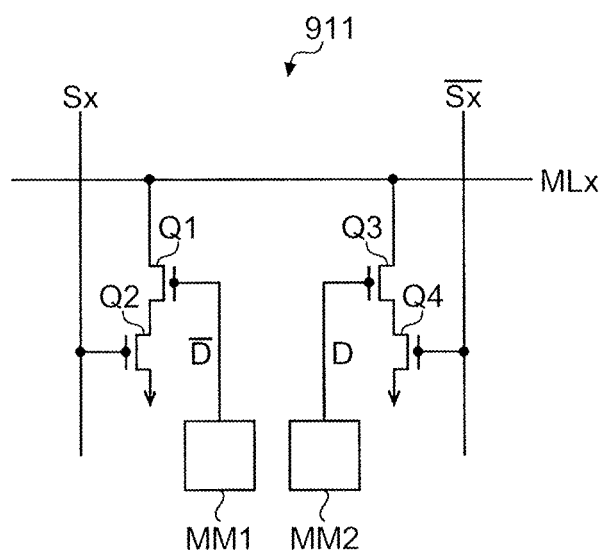
FIG. 38 is a circuit diagram showing a first example of a single-bit comparator according to a sixth embodiment.

FIG. 38 is a circuit diagram showing a first example of a single-bit comparator according to a sixth embodiment. Like the single-bit comparators in the above-described embodiments, a single-bit comparator 911 shown in FIG. 38 has the first input terminal connected to the search line Sx and the second input terminal connected to the inverted search line /Sx, and the first and second match-determination terminals respectively connected to the matching line MLx.

As shown in FIG. 38, the single-bit comparator 911 has multi-context memories MM1 and MM2, the switching transistors Q1 to Q4, and the internal signal line connecting the first and second match-determination terminals. The switching transistor Q1 has a gate connected to a data output terminal of the multi-context memory MM1, a drain connected to the internal signal line, and a source connected to a drain of the switching transistor Q2. The switching transistor Q2 has a gate connected to the first input terminal, and a source connected to the ground line.

Likewise, the switching transistor Q3 has a gate connected to a data output terminal of the multi-context memory MM2, a drain connected to the internal signal line, and a source connected to a drain of the switching transistor Q4. The switching transistor Q4 has a gate connected to the second input terminal, and a source connected to the ground line.

/Second Example (Ternary Single-Bit Comparator with NAND-Type Matching Line and Multi-Context Memory)

Figure 39:
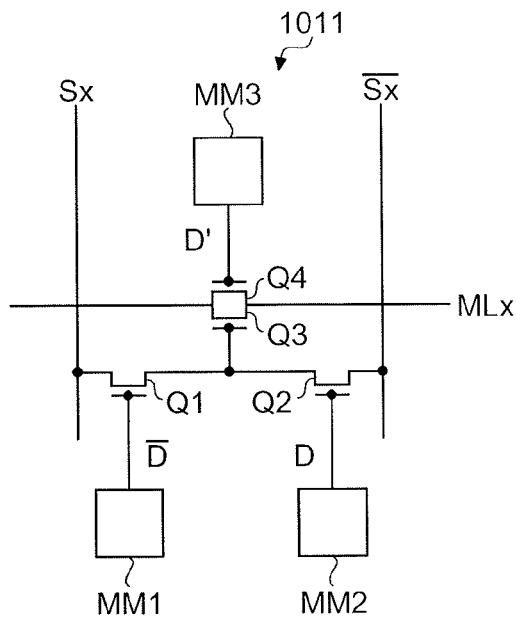
FIG. 39 is a circuit diagram showing a second example of the single-bit comparator according to the sixth embodiment.

FIG. 39 is a circuit diagram showing a second example of the single-bit comparator according to the sixth embodiment. Like the single-bit comparators in the above-described embodiments, a single-bit comparator 1011 shown in FIG. 39 has the first input terminal connected to the search line Sx and the second input terminal connected to the inverted search line /Sx, and the first and second match-determination terminals respectively connected to the matching line MLx.

As shown in FIG. 39, the single-bit comparator 1011 has multi-context memories MM1, MM2 and MM3, the switching transistors Q1 to Q4, and the internal signal line connecting a drain of the switching transistor Q1 and a source of the switching transistor Q2. The switching transistor Q1 has a gate connected to a data output terminal of the multi-context memory MM1, and a source connected to the first input terminal. The second switching transistor Q2 has a gate connected to a data output terminal of the multi-context memory MM2, and a drain connected to the second input terminal. The switching transistor Q3 has a gate connected to the internal signal line, a source connected to the first match-determination terminal, and a drain connected to the second match-determination terminal. The switching transistor Q4 has a gate connected to a data output terminal of the multi-context memory MM3, a source connected to the first match-determination terminal, and a drain connected to the second match-determination terminal. To the gate of the second switching transistor Q2, an output of the multi-context memory MM1 may be inputted via an inverter. In this case, the multi-context memory MM2 can be omitted.

/Third Example (Binary Single-Bit Comparator with NAND-Type Matching Line and Multi-Context Memory)

Figure 40:
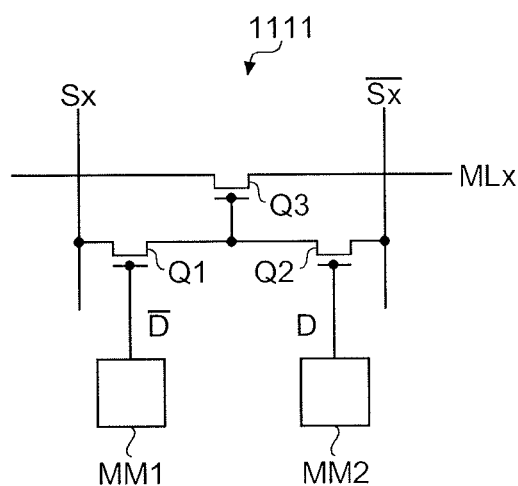
FIG. 40 is a circuit diagram showing a third example of the single-bit comparator according to the sixth embodiment.

FIG. 40 is a circuit diagram showing a third example of the single-bit comparator according to the sixth embodiment. Like the single-bit comparators in the above-described embodiments, a single-bit comparator 1111 shown in FIG. 40 has the first input terminal connected to the search line Sx and the second input terminal connected to the inverted search line /Sx, and the first and second match-determination terminals respectively connected to the matching line MLx.

As shown in FIG. 40, the single-bit comparator 1111 has the multi-context memories MM1 and MM2, the switching transistors Q1 to Q3, and the internal signal line connecting a drain of the switching transistor Q1 and a source of the switching transistor Q2. The switching transistor Q1 has a gate connected to a data output terminal of the multi-context memory MM1, and a source connected to the first input terminal. The switching transistor Q2 has a gate connected to a data output terminal of the multi-context memory MM2, and a drain connected to the second input terminal. The switching transistor Q3 has a gate connected to the internal signal line, a source connected to the first match-determination terminal, and a drain connected to the second match-determination terminal. To the gate of the switching transistor Q2, an output of the multi-context memory MM1 may be inputted via an inverter. In this case, the multi-context memory MM2 can be omitted.

Now, some examples of multi-context memories will be described below.

//First Example (NAND-Type Multi-Context Memory)

Figure 41:
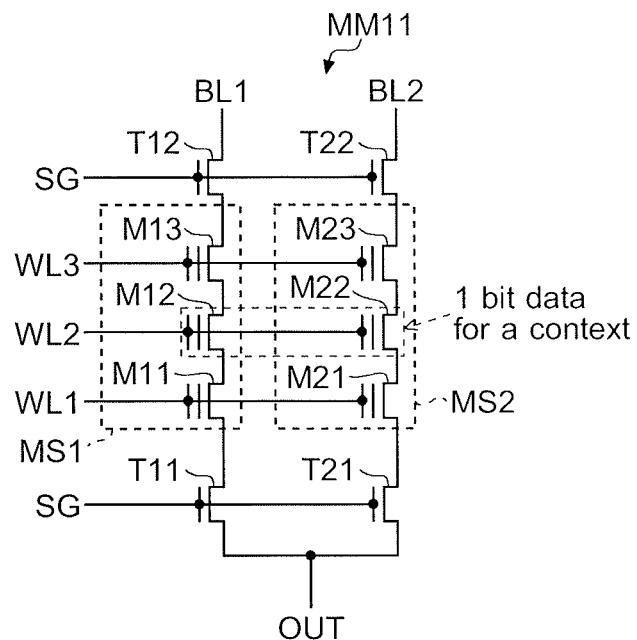
FIG. 41 is a circuit diagram showing an example of a multi-context memory having a string structure in which a plurality of non-volatile memory transistors are connected in a NAND structure.

FIG. 41 is a circuit diagram showing an example of a multi-context memory having a string structure in which a plurality of non-volatile memory transistors are connected in a NAND structure. As shown in FIG. 41, a multi-context memory MM11 has data lines BL1 and BL2, a data output terminal OUT, a common node connecting with the data output terminal OUT, a memory string MS1 including a plurality of non-volatile memory transistors M11 to M13 which are connected between the common node and the data line BL1 in series, and a memory string MS2 including a plurality of non-volatile memory transistors M21 to M23 which are connected between the common node and the data line BL2 in series. At both ends of the memory strings MS1 and MS2, cutoff transistors T11 and T12 and cutoff transistors T21 and T22 can be connected in series, respectively.

Figure 42:
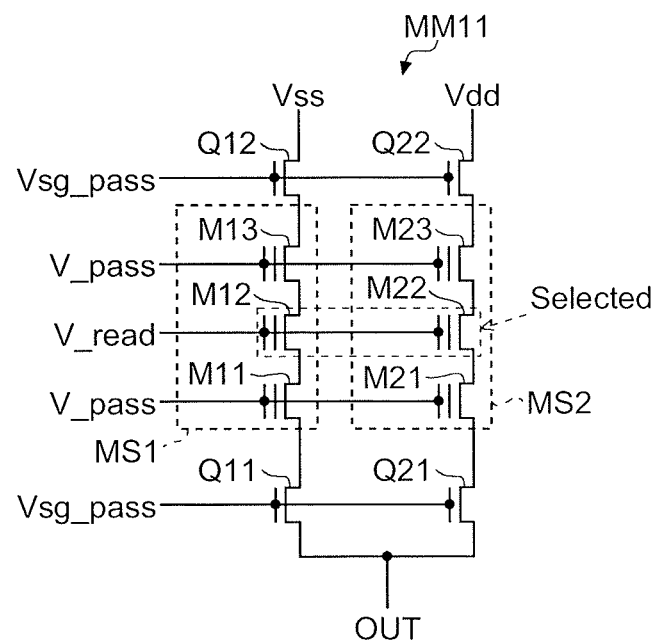
FIG. 42 is a diagram showing an operation of the multi-context memory shown in FIG. 41.

FIG. 42 is a diagram showing the operation of the multi-context memory shown in FIG. 41. As shown in FIG. 42, a pair consisting of one of the non-volatile memory transistors M11 to M13 and one of the non-volatile memory transistors M21 to M23, which are connected to the same control line WL1, WL2 or WL3, stores single bit data (one context data). When logic '0' is stored, it is programmed such that a threshold voltage Vth of the data line BL1 side non-volatile memory transistor is set as the first threshold voltage Vth_LOW, and a threshold voltage Vth of the data line BL2 side non-volatile memory transistor is set as the second threshold voltage Vth_HIGH. When logic '1' is stored, it is programmed such that a threshold voltage Vth of the data line BL1 side non-volatile memory transistor is set as the second threshold voltage Vth_HIGH, and a threshold voltage of the data line BL2 side non-volatile memory transistor is set as the first threshold voltage Vth_LOW.

During the operation, the readout voltage V_read is applied to the control line WL associated with a selected context and the transfer voltage V_pass is applied to the other control lines WL. To the data lines BL1 and BL2, the ground voltage Vss and the supply voltage Vdd are respectively applied. As a result, to the data output terminal OUT, the Vss will be transferred when the selected memory pair stores logic '0', or the supply voltage Vdd will be transferred when the pair stores logic '1'.

//Second Example (NOR-Type Multi-Context Memory)

Figure 43:
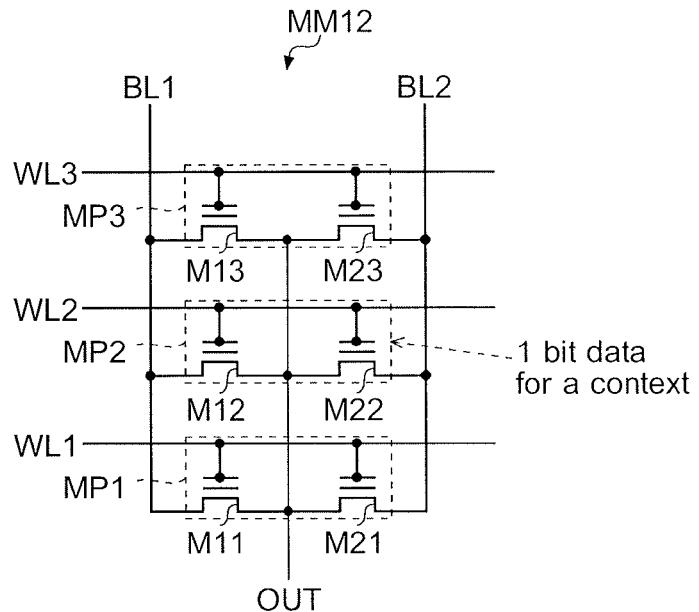
FIG. 43 is a circuit diagram showing an example of a multi-context memory having a structure in which a plurality of non-volatile memory transistors are connected in a NOR structure.

FIG. 43 is a circuit diagram showing an example of a multi-context memory having a structure in which a plurality of non-volatile memory transistors are connected in a NOR structure. As shown in FIG. 43, a multi-context memory MM12 has the data lines BL1 and BL2, the data output terminal OUT, the common node connecting with the data output terminal OUT, the control lines WL1 to WL3, a memory pair MP1 structured with the non-volatile memory transistors M11 and M21, a memory pair MP2 structured with the non-volatile memory transistors M12 and M22, and memory pair MP3 structured with the non-volatile memory transistors M13 and M23.

The non-volatile memory transistor M11 has a gate connected to the control line WL1, a drain connected to the data line BL1, and a source connected to the common node. The non-volatile memory transistor M21 has a gate connected to the control line WL1, a drain connected to the data line BL2, and a source connected to the common node. Likewise, the non-volatile memory transistor M12 or M13 of the memory pair MP2 or MP3 has a gate connected to the control line WL2 or WL3, a drain connected to the data line BL1, and a source connected to the common node. The non-volatile memory transistor M22 or M23 has a gate connected to the control line WL2 or WL3, a drain connected to the data line BL2, and a source connected to the common node.

Figure 44:
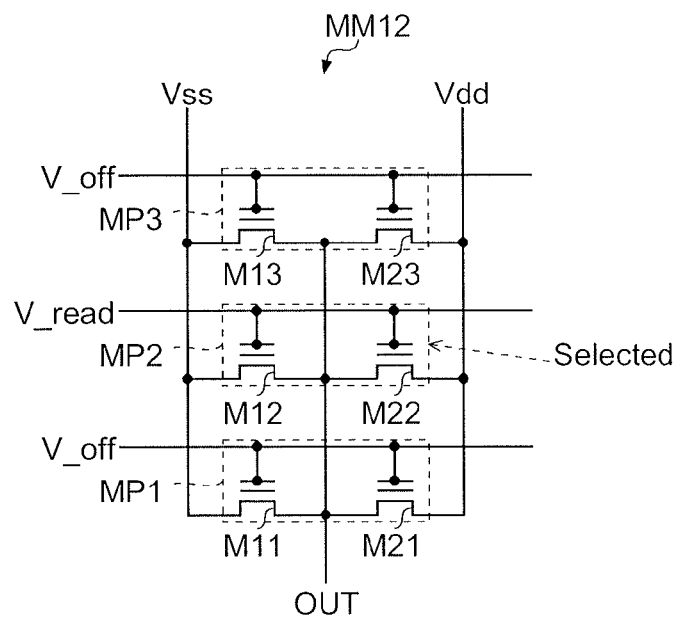
FIG. 44 is a diagram showing an operation of the multi-context memory shown in FIG. 43.

FIG. 44 is a diagram showing the operation of the multi-context memory shown in FIG. 43. A pair consisting of one of the non-volatile memory transistors M11 to M13 and one of the non-volatile memory transistors M21 to M23, which are connected to the same control line WL1, WL2 or WL3, stores single bit data (one context data). When logic '0' is stored, it is programmed such that a threshold voltage Vth of the data line BL1 side non-volatile memory transistor is set as the first threshold voltage Vth_LOW, and a threshold voltage Vth of the data line BL2 side non-volatile memory transistor is set as the second threshold voltage Vth_HIGH. When logic '1' is stored, it is programmed such that a threshold voltage Vth of the data line BL1 side non-volatile memory transistor is set as the second threshold voltage Vth_HIGH, and a threshold voltage of the data line BL2 side non-volatile memory transistor is set as the first threshold voltage Vth_LOW.

During the operation, the readout voltage V_read is applied to the control line WL associated with a selected context and the off voltage V_off is applied to the other control lines WL. To the data lines BL1 and BL2, the ground voltage Vss and the supply voltage Vdd are respectively applied. As a result, to the data output terminal OUT, the Vss will be transferred when the selected memory pair stores logic '0', or the supply voltage Vdd will be transferred when the pair stores logic '1'.

Next, some examples of the single-bit comparators having a multi-context memory and a flip-flop (F/F) will be described.

/Fourth Example (Ternary Single-Bit Comparator with NOR-Type Matching Line, F/F Buffer and Multi-Context Memory)

Figure 45:
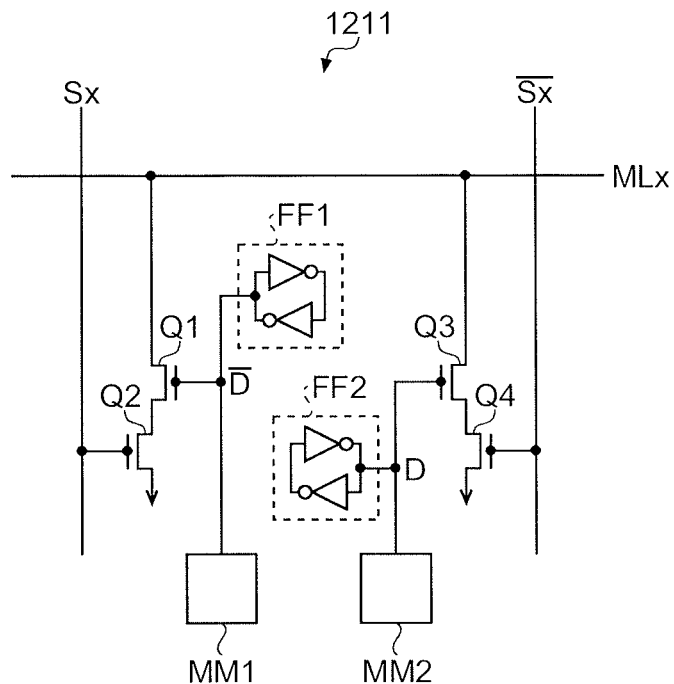
FIG. 45 is a circuit diagram showing a fourth example of the single-bit comparator according to the sixth embodiment.

FIG. 45 is a circuit diagram showing a fourth example of the single-bit comparator according to the sixth embodiment. Like the single-bit comparators in the above-described embodiments, a single-bit comparator 1211 shown in FIG. 45 has the first input terminal connected to the search line Sx and the second input terminal connected to the inverted search line /Sx, and the first and second match-determination terminals respectively connected to the matching line MLx.

As shown in FIG. 45, the single-bit comparator 1211 has flip-flops FF1 and FF2, the multi-context memories MM1 and MM2, the switching transistors Q1 to Q4, and the internal signal line connecting the first match-determination terminal and the second match-determination terminal. The switching transistor Q1 has a gate connected to a data terminal of the flip-flop FF1 and a data output terminal of the multi-context memory MM1, a drain connected to the internal signal line, and a source connected to a drain of the switching transistor Q2. The switching transistor Q2 has a gate connected to the first input terminal, and a source connected to the ground line.

Likewise, the switching transistor Q3 has a gate connected to a data terminal of the flip-flop FF2 and a data output terminal of the multi-context memory MM2, a drain connected to the internal signal line, and a source connected to a drain of the switching transistor Q4. The switching transistor Q4 has a gate connected to the second input terminal, and a source connected to the ground line.

/Fifth Example (Binary Single-Bit Comparator with NOR-Type Matching Line, F/F Buffer and Multi-Context Memory)

Figure 46:
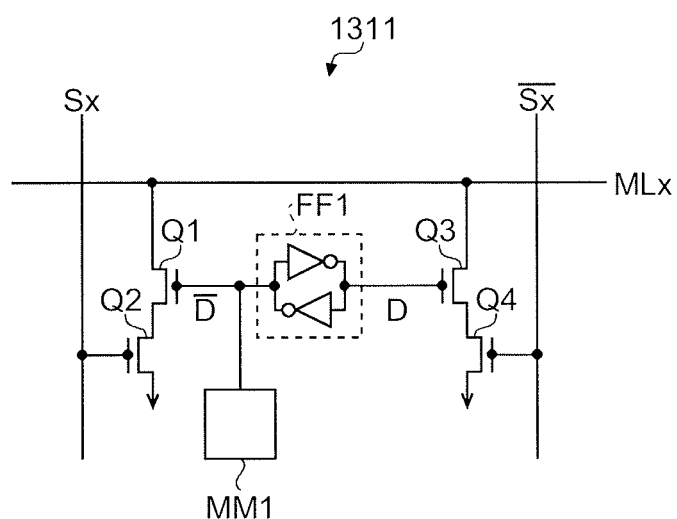
FIG. 46 is a circuit diagram showing a fifth example of the single-bit comparator according to the sixth embodiment.

FIG. 46 is a circuit diagram showing a fifth example of the single-bit comparator according to the sixth embodiment. Like the single-bit comparators in the above-described embodiments, a single-bit comparator 1311 shown in FIG. 46 has the first input terminal connected to the search line Sx and the second input terminal connected to the inverted search line /Sx, and the first and second match-determination terminals respectively connected to the matching line MLx.

As shown in FIG. 46, the single-bit comparator 1311 has the flip-flop FF1, the multi-context memory MM1, the switching transistors Q1 to Q4, and the internal signal line connecting the first match-determination terminal and the second match-determination terminal. The switching transistor Q1 has a gate connected to an inverted data terminal of the flip-flop FF1 and a data output terminal of the multi-context memory MM1, a drain connected to the internal signal line, and a source connected to a drain of the switching transistor Q2. The switching transistor Q2 has a gate connected to the first input terminal, and a source connected to the ground line.

The switching transistor Q3 has a gate connected to a data terminal of the flip-flop FF1, a drain connected to the internal signal line, and a source connected to a drain the switching transistor Q4. The switching transistor Q4 has a gate connected to the second input terminal, and a source connected to the ground line.

/Sixth Example (Ternary Single-Bit Comparator with NAND-Type Matching Line, F/F Buffer and Multi-Context Memory)

Figure 47:
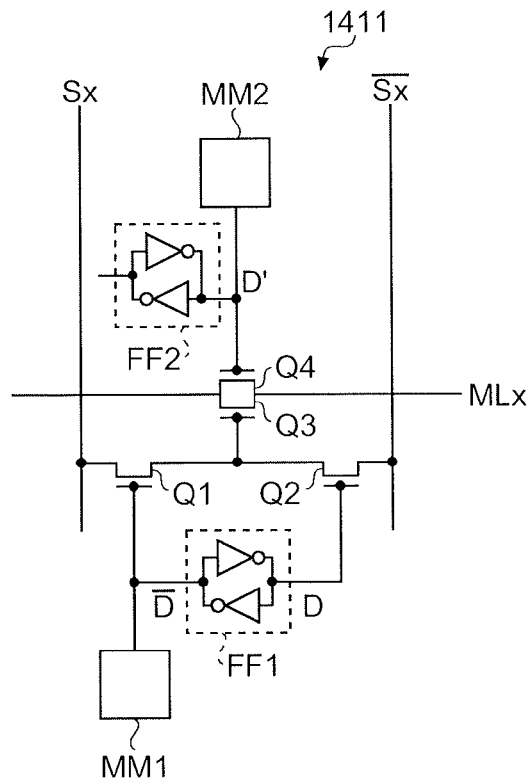
FIG. 47 is a circuit diagram showing a sixth example of the single-bit comparator according to the sixth embodiment.

FIG. 47 is a circuit diagram showing a sixth example of the single-bit comparator according to the sixth embodiment. Like the single-bit comparators in the above-described embodiments, a single-bit comparator 1411 shown in FIG. 47 has the first input terminal connected to the search line Sx and the second input terminal connected to the inverted search line /Sx, and the first and second match-determination terminals respectively connected to the matching line MLx.

As shown in FIG. 47, the single-bit comparator 1411 has the flip-flops FF1 and FF2, the multi-context memories MM1 and MM2, the switching transistors Q1 to Q4, and the internal signal line connecting a drain of the switching transistor Q1 and a source of the switching transistor Q2. The switching transistor Q1 has a gate connected to an inverted data terminal of the flip-flop FF1 and a data output terminal of the multi-context memory MM1, and a source connected to the first input terminal. The switching transistor Q2 has a gate connected to a data output terminal of the flip-flop FF1, and a drain connected to the second input terminal.

The switching transistor Q3 has a gate connected to the internal signal line, a source connected to the first match-determination terminal, and a drain connected to the second match-determination terminal. The switching transistor Q4 has a gate connected to a data terminal of the flip-flop FF2 and a data output terminal of the multi-context memory MM2, a source connected to the first match-determination terminal, and a drain connected to the match-determination terminal.

/Seventh Example (Binary Single-Bit Comparator with NAND-Type Matching Line, F/F Buffer and Multi-Context Memory)

Figure 48:
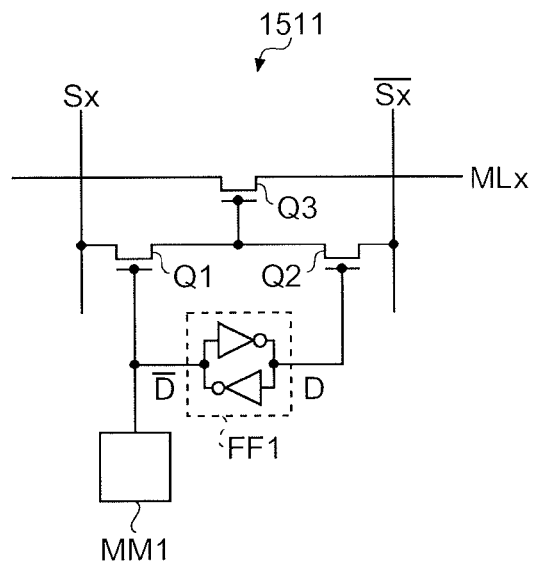
FIG. 48 is a circuit diagram showing a seventh example of the single-bit comparator according to the sixth embodiment.

FIG. 48 is a circuit diagram showing a seventh example of the single-bit comparator according to the sixth embodiment. Like the single-bit comparators in the above-described embodiments, a single-bit comparator 1511 shown in FIG. 48 has the first input terminal connected to the search line Sx and the second input terminal connected to the inverted search line /Sx, and the first and second match-determination terminals respectively connected to the matching line MLx.

As shown in FIG. 48, the single-bit comparator 1511 has the flip-flop FF1, the multi-context memory MM1, the switching transistors Q1 to Q3, and the internal signal line connecting a source of the switching transistor Q1 and a drain of the switching transistor Q2. The switching transistor Q1 has a gate connected to an inverted data terminal of the flip-flop FF1 and a data output terminal of the multi-context memory MM1, and a source connected to the first input terminal. The switching transistor Q2 has a gate connected to a data terminal of the flip-flop FF1, and a source connected to the second terminal.

The switching transistor Q3 has a gate connected to the internal signal line, a source connected to the first match-determination terminal, and a drain connected to the second match-determination terminal.

The single-bit comparators 1211 to 1511 shown in FIGS. 45 to 48 as described above transfer output data of the multi-context memories MM1 and/or MM2 to the flip-flops FF1 and/of FF2 when switching the context, and store the data in the flip-flops FF1 and/of FF2. While the reconfigurable logic circuit is operating, the flip-flops FF1 and/or FF2 serves to store and output the configuration data. Therefore, it is possible to set voltage of all the control lines WL1 to WL3 of the multi-context memories MM1 and/or MM2 as 0V during the operation.

If the transfer voltage V_pass or the readout voltage V_read is constantly applied to the control lines WL1 to WL3 during the operation, miss-writing (read disturb) of data may occur. In contrast, by having the flip-flops FF1 and/or FF2 as buffers as described above, it is possible to avoid such trouble. For example, according to the structures of the single-bit comparators 1211 to 1511 shown in FIGS. 45 to 48, the readout voltage V_read or the transfer voltage V_pass is applied to the control lines WL1 to WL3 only at the time of switching of the context, and during the other operation, a voltage of the control lines WL1 to WL3 can be set as 0V.

While certain combination have been described, those embodiments have been presented by way of example only, and are not intended to limited the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the LUT circuit and the MUX circuit according to the above-described embodiments can be installed in a programmable integrated circuit such as a FPGA (field-programmable gate array) device.

What is claimed is:
1. A circuit comprising:
a plurality of bit-string comparators each of which includes
  a plurality of single-bit comparators each of which includes first and second input terminals, first and second match-determination terminals, and a memory storing data and inverted data in a pair, the first input terminal being connected to a respective search line, the second input terminal being connected to an inverted search line being paired with the respective search line, and
  a matching line connecting the first and second match-determination terminals of the single-bit comparators;
a pre-charge transistor of which source is connected to a supply voltage line;
a common matching line connected to a drain of the pre-charge transistor and the matching lines of the bit-string comparators; and
an output inverter of which input is connected to the common matching line.
2. The circuit according to claim 1, wherein
when the number of the pairs of the search line and the inverted search line is defined as Nin and the number of the bit-string comparators is defined as Ncomp, the following formula (1) is established between Nin and Ncomp $$N\text{comp} \geq 2^{Nin}/2 \qquad (1).$$

3. The circuit according to claim 1, wherein
the memories of at least one of the bit-string comparators store an input bit string of which output is logic '1' in a multi-input single-output truth table.

4. The circuit according to claim 1, wherein
a pair of input bit strings between which hamming distance is 1 among the input bit strings each of which output is logic '1' in a multi-input single-output truth table is expressed as a reduced expression bit string in which a miss-matching bit therebetween is changed to a don't-care bit, and
the memories of at least one of the bit-string comparators store the reduced expression bit string.

5. The circuit according to claim 1, wherein
the single-bit comparator includes first and second non-volatile memory transistors,
a gate of the first non-volatile memory transistor being connected to the first input terminal,
a gate of the second non-volatile memory transistor being connected to the second input terminal,
a source of the first non-volatile memory transistor being connected to the first match-determination terminal,
a drain of the second non-volatile memory transistor being connected to the second match-determination terminal, and
a drain of the first non-volatile memory transistor being connected to a source of the second non-volatile memory transistor.

6. The circuit according to claim 5, wherein
when a threshold voltage in an erased state of a non-volatile memory transistor is defined as a first threshold voltage, a threshold voltage in a written state of the non-volatile memory transistor is defined as a second threshold voltage, a voltage being higher than the first threshold voltage and being lower than the second threshold voltage is defined as a readout voltage, and a voltage higher than the second threshold voltage is defined as a transfer voltage, voltages applied to the search line and the inverted search line are set as the readout voltage and the transfer voltage when search data is 0, set as the transfer voltage and the readout voltage when the search data is 1, or both set as the transfer voltage when the search data is a mask bit,
the first non-volatile memory transistor stores the inverted data,
the second non-volatile memory transistor stores the data, and
the data and the inverted data are assigned the second threshold voltage and the first threshold voltage when a storage data is 0, assigned the first threshold voltage and the second threshold voltage when the storage data is 1, or both assigned the first threshold voltage when the storage data is a don't-care bit.

7. The circuit according to claim 1, wherein
the single-bit comparator includes first and second flip-flops, first and second multi-context memories, first to fourth switching transistors, and an internal signal line connecting a drain of the first switching transistor and a source of the second switching transistor,
a gate of the first switching transistor being connected to a first data terminal of the first flip-flop and a data output terminal of the first multi-context memory,
a source of the first switching transistor being connected to the first input terminal,
a gate of the second switching transistor being connected to a second data terminal of the first flip-flop,
a drain of the second switching transistor being connected to the second input terminal,
a gate of the third switching transistor being connected to the internal signal line,
a source of the third switching transistor being connected to the first match-determination terminal,
a drain of the third switching transistor being connected to the second match-determination terminal,
a gate of the fourth switching transistor being connected to a first data terminal of the second flip-flop and a data output terminal of the second multi-context memory,
a source of the fourth switching transistor being connected to the first match-determination terminal, and
a drain of the fourth switching transistor being connected to the second match-determination terminal.

8. The circuit according to claim 1, wherein
the single-bit comparator includes at least a multi-context memory, and
the multi-context memory includes
first and second data line,
a data output terminal,
a common node connecting with the data output terminal,
a first memory string including first and second non-volatile memory transistors which connect in series between the common node and the first data line, and
a second memory string including third and fourth non-volatile memory transistors which connect in series between the common node and the second data line.

9. The circuit according to claim 1, wherein
the single-bit comparator includes at least a multi-context memory, and
the multi-context memory includes
first and second data line,
a data output terminal,
a common node connecting with the data output terminal,
first and second control line,
a first memory pair includes a first non-volatile memory transistor of which gate is connected to the first control line, of which drain is connected to the first data line, and of which source is connected to the common node, and a second non-volatile memory transistor of which gate is connected to the first control line, of which drain is connected to the second data line, and of which source is connected to the common node, and
a second memory pair includes a third non-volatile memory transistor of which gate is connected to the second control line, of which drain is connected to the first data line, and of which source is connected to the common node, and a fourth non-volatile memory transistor of which gate is connected to the second control line, of which drain is connected to the second data line, and of which source is connected to the common node.

10. A circuit comprising:
a common matching line;
a plurality of bit-string comparators each of which includes
a plurality of single-bit comparators each of which includes first and second input terminals, first and second match-determination terminals, and a memory storing data and inverted data in a pair, the first input terminal being connected to a respective search line, the second input terminal being connected to an inverted search line being paired with the respective search line, a matching line connecting the first and second match-determination terminals of the single-bit comparators, a first transistor of which gate is connected to the matching line and drain is connected to the common matching line, and a first pre-charge transistor of which drain is connected to the matching line and source is connected to a supply voltage line;

a second pre-charge transistor of which source is connected to the supply voltage line and drain is connected to the common matching line; and an output inverter of which input is connected to the common matching line.

11. The circuit according to claim 10, wherein
when the number of the pairs of the search line and the inverted search line is defined as Nin and the number of the bit-string comparators is defined as Ncomp, the following formula (1) is established between Nin and Ncomp $$N\text{comp} \geq 2^{Nin}/2 \qquad (1).$$

12. The circuit according to claim 10, wherein
the memories of at least one of the bit-string comparators store an input bit string of which output is logic '1' in a multi-input single-output truth table.

13. The circuit according to claim 10, wherein
a pair of input bit strings between which hamming distance is 1 among the input bit strings each of which output is logic '1' in a multi-input single-output truth table is expressed as a reduced expression bit string in which a miss-matching bit therebetween is changed to a don't-care bit, and the memories of at least one of the bit-string comparators store the reduced expression bit string.

14. The circuit according to claim 10, wherein
the single-bit comparator includes first and second non-volatile memory transistors, the first and second match-determination terminals, an internal signal line connecting the first and second match-determination terminals, and a ground line, a gate of the first non-volatile memory transistor being connected to the first input terminal, a gate of the second non-volatile memory transistor being connected to the second input terminal, a drain of the first non-volatile memory transistor being connected to the internal signal line, a drain of the second non-volatile memory transistor being connected to the internal signal line, a source of the first non-volatile memory transistor being connected to the ground line, and a source of the second non-volatile memory transistor being connected to the ground line.

15. The circuit according to claim 14, wherein
when a threshold voltage in an erased state of a non-volatile memory transistor is defined as a first threshold voltage, a threshold voltage in a written state of the non-volatile memory transistor is defined as a second threshold voltage, a voltage being lower than the first threshold voltage is defined as an off voltage, and a voltage higher than the first threshold voltage and lower than the second threshold voltage is defined as a readout voltage, voltages applied to the search line and the inverted search line are set as the readout voltage and the off voltage when search data is 0, set as the off voltage and the readout voltage when the search data is 1, or both set as the off voltage when the search data is a mask bit, the first non-volatile memory transistor stores the inverted data, the second non-volatile memory transistor stores the data, and the data and the inverted data are assigned the first threshold voltage and the second threshold voltage when a storage data is 0, assigned the second threshold voltage and the first threshold voltage when the storage data is 1, or both assigned the second threshold voltage when the storage data is a don't-care bit.

16. The circuit according to claim 10, wherein
the single-bit comparator includes first and second flip-flops, first and second multi-context memories, first to fourth switching transistors, an internal signal line connecting the first match-determination terminal and the second match-determination terminal, and a ground line, a gate of the first switching transistor being connected to a first data terminal of the first flip-flop and a data output terminal of the first multi-context memory, a drain of the first switching transistor being connected to the internal signal line, a source of the first switching transistor being connected to a drain of the second switching transistor, a gate of the second switching transistor being connected to the first input terminal, a source of the second switching transistor being connected to the ground line, a gate of the third switching transistor being connected to the first data terminal of the second flip-flop and a data output terminal of the second multi-context memory, a drain of the third switching transistor being connected to the internal signal line, a source of the third switching transistor being connected to a drain of the fourth switching transistor, a gate of the fourth switching transistor being connected to the second input terminal, and a source of the fourth switching transistor being connected to the ground line.

17. The circuit according to claim 10, wherein
the single-bit comparator includes at least a multi-context memory, and the multi-context memory includes
first and second data line,
a data output terminal,
a common node connecting with the data output terminal,
a first memory string including first and second non-volatile memory transistors which connect in series between the common node and the first data line, and
a second memory string including third and fourth non-volatile memory transistors which connect in series between the common node and the second data line.

18. The circuit according to claim 10, wherein
the single-bit comparator includes at least a multi-context memory, and the multi-context memory includes
first and second data line,
a data output terminal,
a common node connecting with the data output terminal,
first and second control line, a first memory pair includes a first non-volatile memory transistor of which gate is connected to the first control line, of which drain is connected to the first data line, and of which source is connected to the common node, and a second non-volatile memory transistor of which gate is connected to the first control line, of which drain is connected to the second data line, and of which source is connected to the common node, and a second memory pair includes a third non-volatile memory transistor of which gate is connected to the second control line, of which drain is connected to the first data line, and of which source is connected to the common node, and a fourth non-volatile memory transistor of which gate is connected to the second control line, of which drain is connected to the second data line, and of which source is connected to the common node.

19. A circuit comprising:

a bit-string comparator including a plurality of single-bit comparators each of which includes first and second input terminals, first and second match-determination terminals, and a memory storing data and inverted data in a pair, the first input terminal being connected to a respective search line, the second input terminal being connected to an inverted search line being paired with the respective search line, and a matching line connecting the first and second match-determination terminals of the single-bit comparators;

a pre-charge transistor of which source is connected to a supply voltage line;

a common matching line connected to a drain of the pre-charge transistor and the matching line; and an output inverter of which input is connected to the common matching line.

20. The circuit according to claim 19, wherein the matching line is a NOR-type matching line, one of the single-bit comparators connecting with a pair of selected search line and inverted search line stores logic '0', and the other one of the single-bit comparators connecting with a pair of non-selected search line and inverted search line stores a don't-care bit.

21. The circuit according to claim 19, wherein the matching line is a NAND-type matching line, one of the single-bit comparators connecting with a pair of selected search line and inverted search line stores logic '1', and the other one of the single-bit comparators connecting with a pair of non-selected search line and inverted search line stores a don't-care bit.

22. A circuit comprising:

a plurality of the circuits according to claim 19, wherein the plurality of the circuits share the search lines and the inverted search lines.

\* \* \* \* \*